United States Patent
Samukawa et al.

(10) Patent No.: US 7,520,956 B2
(45) Date of Patent: Apr. 21, 2009

(54) ON-WAFER MONITORING SYSTEM

(75) Inventors: Seiji Samukawa, Sendai (JP); Tadashi Shinmura, Tokyo (JP); Mitsuru Okigawa, Nagoya (JP)

(73) Assignee: Tohoku Techno Arch Co., Ltd. (JP)

( * ) Notice: Subject to any disclaimer, the term of this patent is extended or adjusted under 35 U.S.C. 154(b) by 291 days.

(21) Appl. No.: 10/501,351

(22) PCT Filed: Feb. 3, 2003

(86) PCT No.: PCT/JP03/01079

§ 371 (c)(1),
(2), (4) Date: Jul. 14, 2004

(87) PCT Pub. No.: WO03/081654

PCT Pub. Date: Oct. 2, 2003

(65) Prior Publication Data
US 2005/0115673 A1 Jun. 2, 2005

(30) Foreign Application Priority Data
Mar. 26, 2002 (JP) .............................. 2002-086196

(51) Int. Cl.
C23F 1/00 (2006.01)
H01L 21/306 (2006.01)
H01L 23/58 (2006.01)
G01R 27/26 (2006.01)

(52) U.S. Cl. .......................... 156/345.28; 156/345.13; 156/345.15; 156/345.24; 257/48; 324/678

(58) Field of Classification Search ............ 156/345.13, 156/345.15, 345.24, 345.28
See application file for complete search history.

(56) References Cited

U.S. PATENT DOCUMENTS

| 5,444,259 | A  | * | 8/1995  | Ohmi ..................... 250/492.21 |
| 5,444,637 | A  | * | 8/1995  | Smesny et al. ............... 702/127 |
| 5,451,784 | A  |   | 9/1995  | Loewenhardt et al. ...... 250/305 |
| 5,896,196 | A  | * | 4/1999  | Pinnaduwage ............... 356/311 |
| 6,326,794 | B1 | * | 12/2001 | Lundquist et al. ........... 324/678 |
| 6,333,544 | B1 | * | 12/2001 | Toyoda et al. ............... 257/431 |
| 6,423,242 | B1 | * | 7/2002  | Kojima et al. ................. 216/79 |
| 6,576,922 | B1 | * | 6/2003  | Ma et al. ....................... 257/48 |
| 6,673,636 | B2 | * | 1/2004  | Ma ............................... 438/14 |
| 2001/0014520 | A1 |   | 8/2001 | Usui et al. ................... 438/586 |
| 2004/0007326 | A1 | * | 1/2004 | Roche et al. ........... 156/345.24 |
| 2004/0021094 | A1 | * | 2/2004 | Johnson et al. ........ 250/492.21 |

FOREIGN PATENT DOCUMENTS

JP 09/266199 10/1997

* cited by examiner

Primary Examiner—Parviz Hassanzadeh
Assistant Examiner—Rakesh K Dhingra
(74) Attorney, Agent, or Firm—Hayes Soloway PC

(57) ABSTRACT

An on-wafer monitoring system is placed at a position of a substrate to be treated in a plasma treatment device. The on-wafer monitoring system includes various sensors, a data I/O unit for optically inputting/outputting data to/from outside, and an internal power source unit for supplying power to them. The on-wafer data I/O unit is connected to a laser diode (LD) and a photo diode (PD) which are optical I/O units installed outside. The data I/O unit receives an instruction from outside and transmits monitored data to outside. Sensors arranged on the substrate are an ion energy analyzer, a VUV photon detector, and a radical ion species emission spectrophotometer.

11 Claims, 21 Drawing Sheets

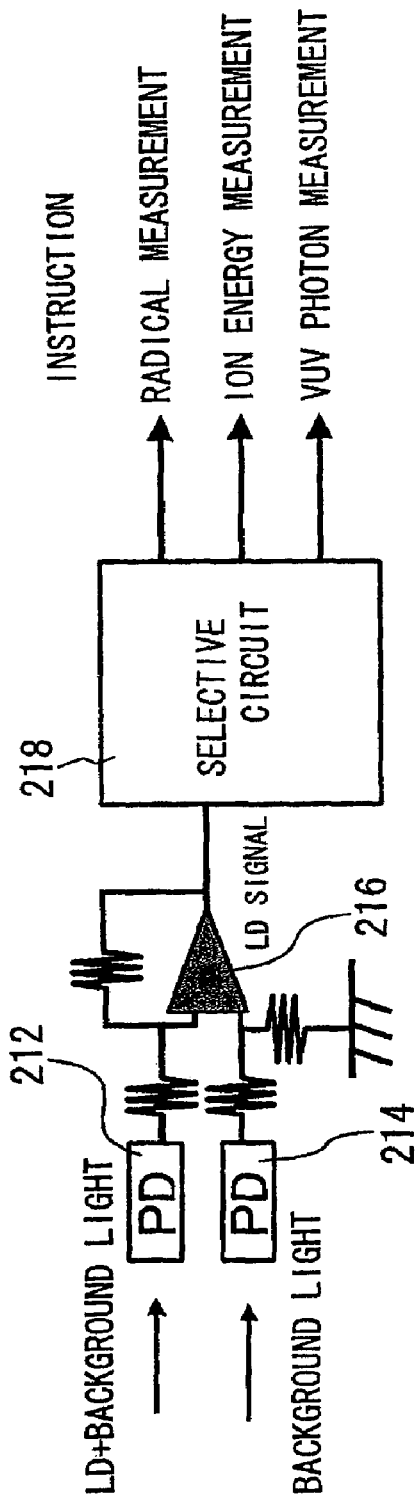
Fig. 4 (a) INPUT
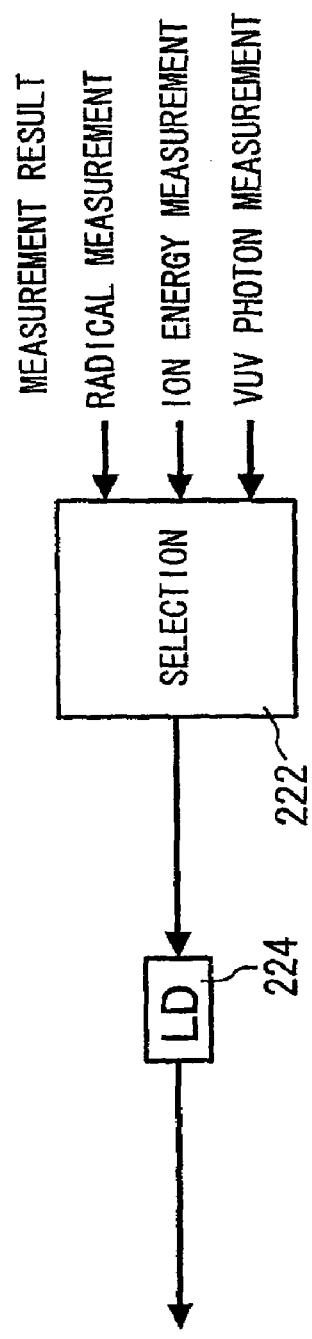
Fig. 4 (b) OUTPUT

STRUCTURE OF ON-WAFER ION ENERGY ANALYZER

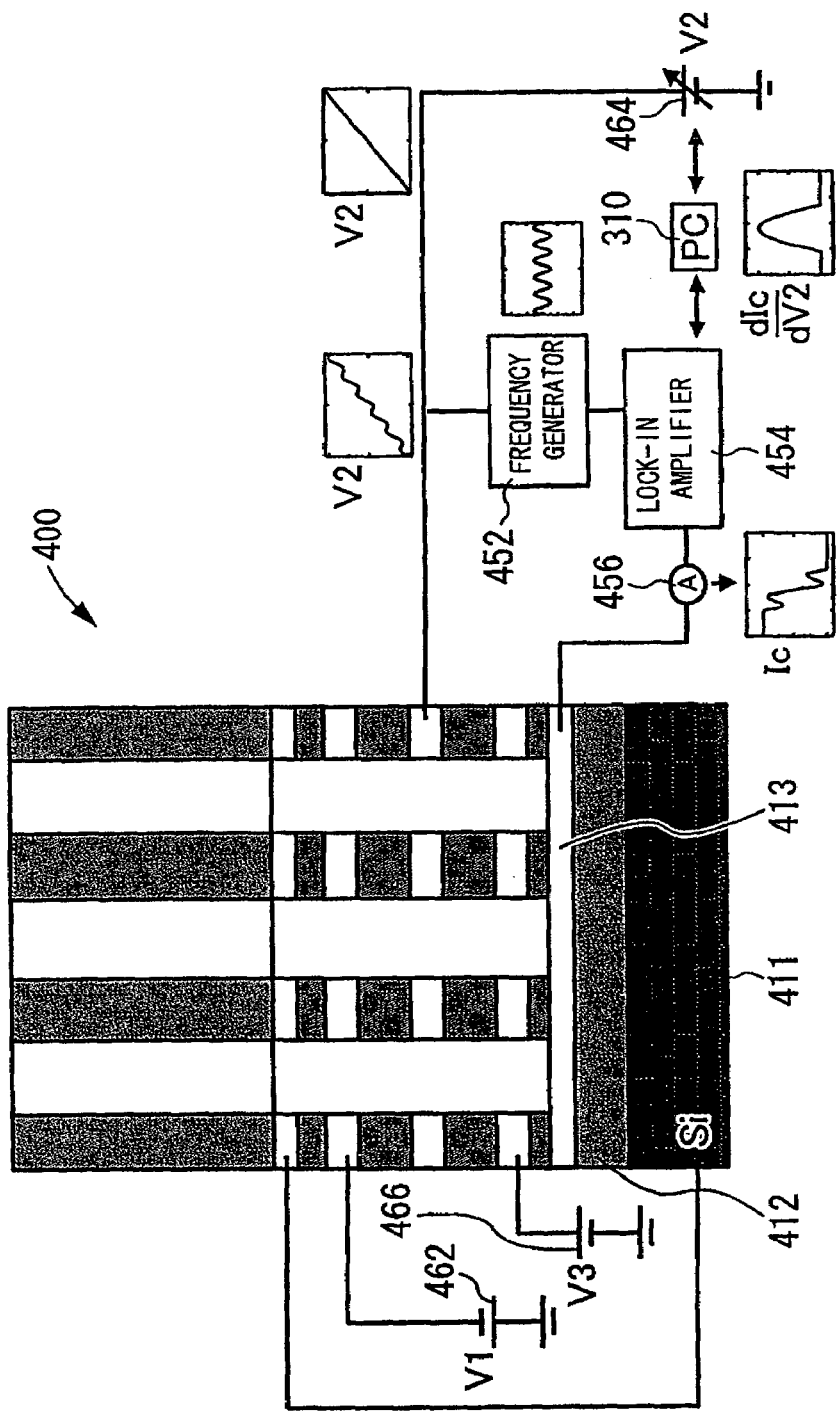
Fig. 8 MEASUREMENT SYSTEM OF ON-WAFER ION ENERGY ANALYZER

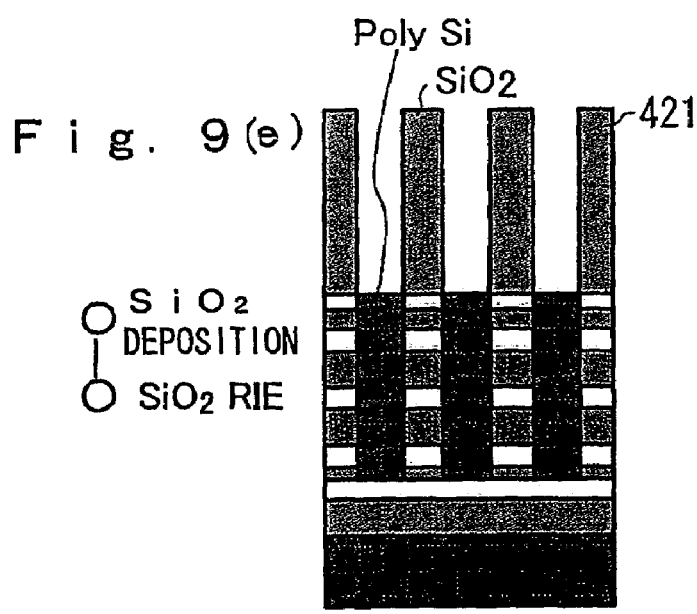
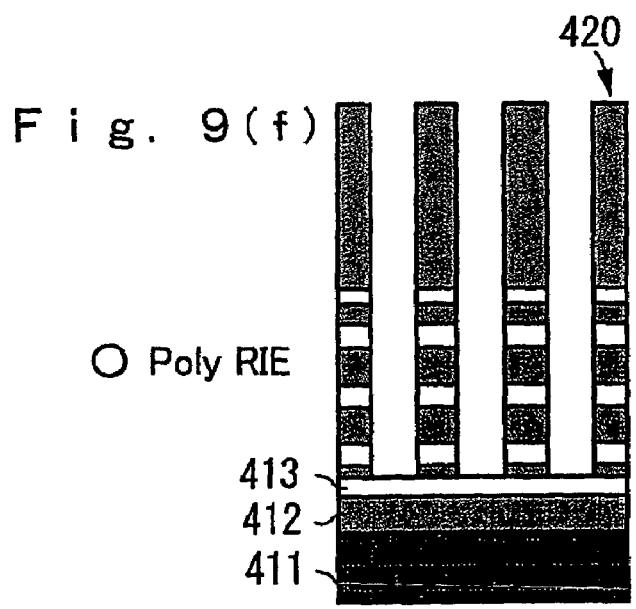

MICRO SPECTROSCOPE

MANUFACTURING PROCESS OF MICRO ION RADICAL ANALYZER (1)
Fig. 16(a) OXIDATION
Fig. 16(b) Si DEPOSITION, ETCHING
Fig. 16(c) Aℓ VAPOR DEPOSITION, ETCHING
Fig. 16(d) $SiO_2$ DEPOSITION, ETCHING
Fig. 16(e) Pt DEPOSITION, PATTERNING
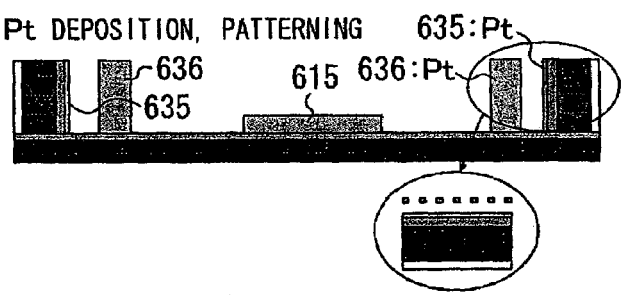
Fig. 16(f) $Si_3N_4$ DEPOSITION, ETCHING
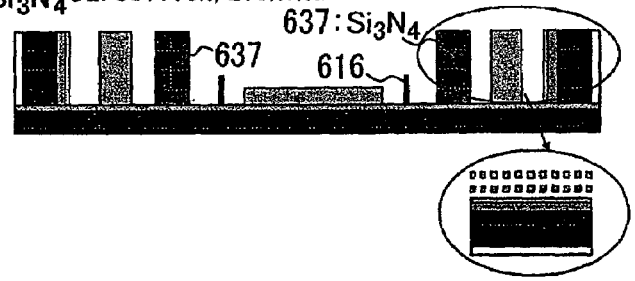

MANUFACTURING PROCESS OF MICRO ION RADICAL ANALYZER (2)
Fig. 17(g) SiO2 DEPOSITION, ETCHING
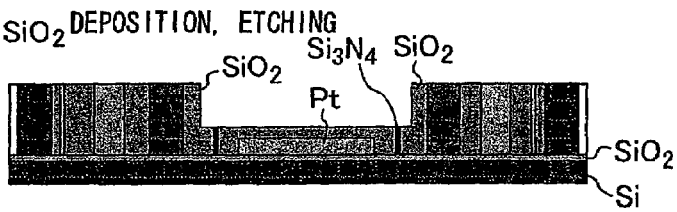
Fig. 17(h) Si3N4 DEPOSITION, ETCHING
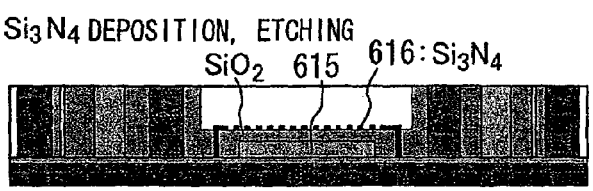
Fig. 17(i) SiO2 DEPOSITION, ETCHING
FORMATION OF WAVEGUIDE
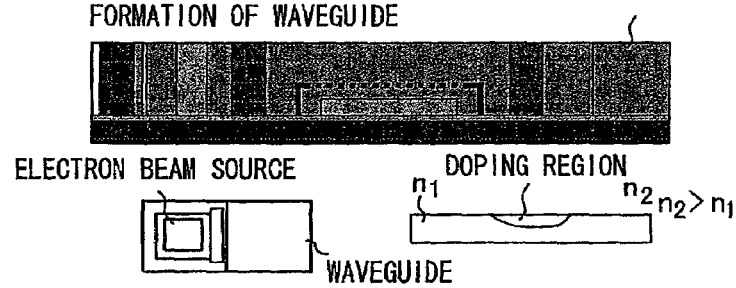
Fig. 17(j) Si3N4, Si DEPOSITION
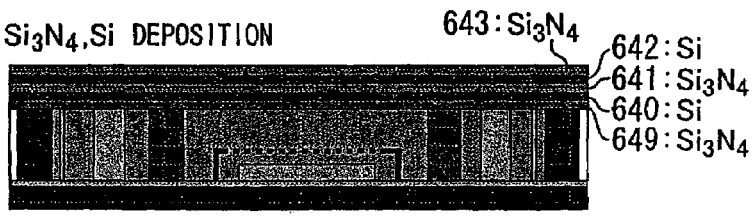
Fig. 17(k) Si3N4, Si ETCHING
SiO2 SACRIFICE LAYER ETCHING
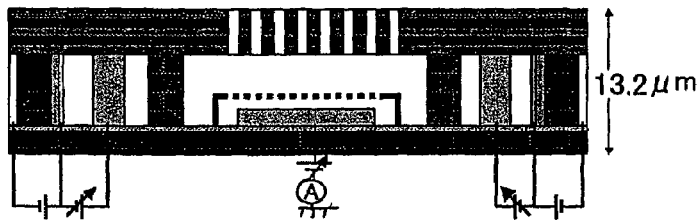

ON-WAFER MONITORING SYSTEM

TECHNICAL FIELD

The present invention relates to a micro nano-sensing system technology for measuring plasma on a wafer surface in a plasma treatment device.

BACKGROUND ART

FIG. 1 shows an outline of a plasma treatment device 100 used in semiconductor manufacturing process. The drawing shows the state where a substrate 130 masked by resist 132 is processed by using plasma 110 in the plasma treatment device 100. Regarding the plasma 110, gas (such as $Cl_2$) is introduced in vacuum (1 Torr to $10^{-4}$ Torr), and high-frequency electric field (400 kHz to 2.45 MHz) is applied to generate the plasma 110. By using the plasma 110 and applying substrate power source (400 kHz to 13.56 GHz) to the substrate 130 masked by the resist 132, the processing is performed. In the plasma treatment device, vapor phase reaction control of plasma (distribution control of electron energy, optimizing gas molecule structure, dwell time control, and the like) and surface reaction control of the substrate (substrate temperature control, surface impurity control, reactive product control, substrate bias control, and the like) need to be performed.

As an evaluation method of the plasma treatment device, there is a typical evaluation method using a probe such as Langmuir probe. By the evaluation method using the probe, only the characteristic in the plasma is measured, and the density and the energy of various kinds of particles that are made incident to a material to be processed by the plasma cannot be measured.

In pattern dimensions of a substrate of a material to be processed, which is processed or deposited by the plasma treatment device, microfabrication has been progressed to the order of a few hundred nm. Therefore, needs has been increased for measuring the characteristics of various kinds of particles made incident inside such fine patterns from the plasma.

To measure the characteristics of the particles made incident to the substrate to be processed, pinholes are formed on a flat plate, an energy analyzer of a blocking electric field type is installed behind them, and the incident particles are measured. In the conventional method, the size of the pinholes is about a few mm that is in an entirely different value from actual processing dimensions, and thus it was impossible to accurately measure the incident particles. Further, a differential exhaust system has been required to restrict the changes of energy and charge state caused by the collision among particles in an analyzer tube of an energy analyzer, and the actual measurement on an in-service plasma treatment device was virtually impossible.

As described, a conventional plasma measurement system has a large and complicate apparatus (probe, mass spectrometer, and the like) and causes large disturbance in plasma. For this reason, the most important plasma measurement on a wafer surface where etching reaction progresses in micro nano-scale cannot be performed by the conventional plasma measurement system. In addition, since the cost of apparatus was expensive and so on, it has been difficult to apply it to an actual production apparatus.

Meanwhile, plasma etching of a silicon oxide film is cited as a typical example of the microfabrication processing in the semiconductor manufacturing process. Ions having the energy of a few hundred eV are needed in order to contribute to the etching of the silicon oxide film. In the case of measuring the ion energy distribution by the blocking electric field type energy analyzer, high voltage needs to be applied to a blocking electric field generating electrode.

The object of the present invention is to provide an on-wafer monitoring system capable of monitoring at the position of a substrate, which is an object to be processed, in the plasma treatment device.

DISCLOSURE OF THE INVENTION

To achieve the above-described object, the present invention is an on-wafer monitoring system capable of measuring the operation of the plasma treatment device on wafer, which comprises one or a plurality of sensor sections, a power source unit, and an I/O unit that inputs/outputs signals from/to outside, which are provided on a silicon substrate, in which the sensor sections have pattern portions, and a plurality of electrodes for separating ions and electrons of plasma by energy, and electrodes having the same potential as that of the silicon substrate directly under the pattern portions, in which the power source unit can be constituted such that power is taken out from plasma potential or power is taken out from photoelectromotive force of a PLZT device.

A plurality of electrodes of the sensor section are Al electrodes, and space between each of the Al electrodes may be insulated by $\gamma$-$Al_2O_3$. The side surface of the Al electrodes may be covered with a thin oxide film.

The power source unit can be constituted such that power is taken out from plasma potential or power is taken out from photoelectromotive force of a PLZT device. Further, the I/O unit can input/output signals from/to outside via light.

As the sensor, an ion energy analyzer, which has a collector electrode at the bottom of the sensor section and obtains ion energy distribution by measuring ion electric current in the collector electrode, can be included.

As the sensor, it is a photon detector that detects light made incident into the patterns by photoinduced current generated in an insulating film. A metal thin film is formed on the insulating film, and the photon detector can also detect light having energy equivalent to or more than an energy difference between the work function of the metal and the conduction band bottom of the insulating film out of light transmitted the metal thin film.

Furthermore, as the sensor, a photon detector that detects light by a photodiode can be included.

As the sensor, an ion radical analyzer, which identifies radicals and ions by detecting light emission caused by the collision between electrons from an electron gun and radicals or ions, can be included, and the ion radical analyzer can have spectroscope for detecting light emission.

As the sensor, a probe that detects at least one of electron current, electron energy distribution, ion current, electron temperature, electron density and charge storage amount can be included.

BRIEF DESCRIPTION OF THE DRAWINGS

FIGS. 4(a)-4(b) are views showing a constitution of an I/O unit of the on-wafer monitoring system.

FIG. 8 is a view showing a measurement system of the ion energy analyzer.

FIGS. 16(*a*)-16(*f*) are views showing a manufacturing process of the ion radical analyzer.

FIGS. 17(*g*)-17(*k*) are views showing a continued manufacturing process of the ion radical analyzer.

BEST MODE FOR CARRYING OUT THE INVENTION

The embodiments of the present invention will be described in detail with reference to the drawings.

Figure 1:
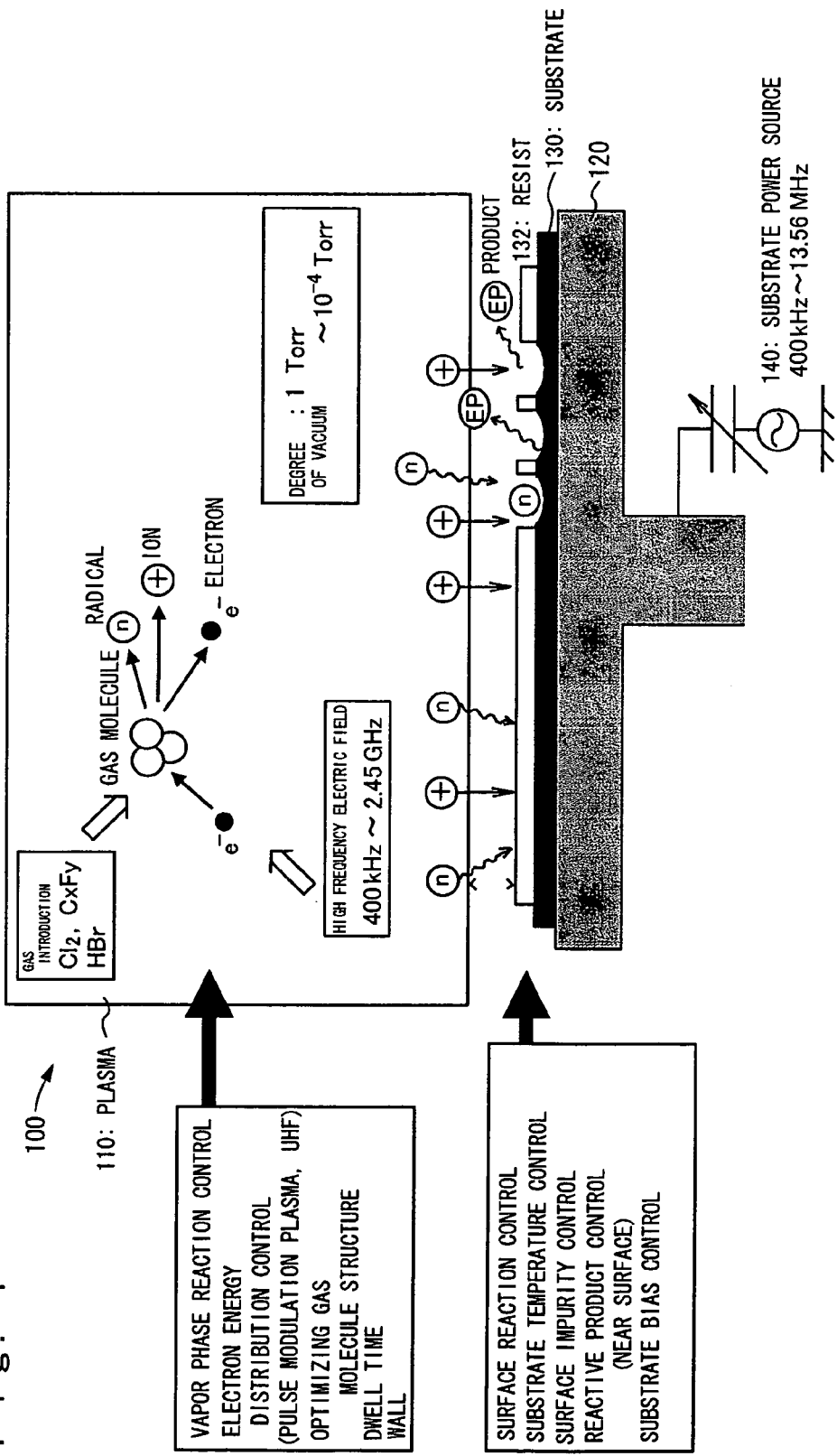
FIG. 1 is a view showing the outline of a plasma treatment device.
Figure 2:
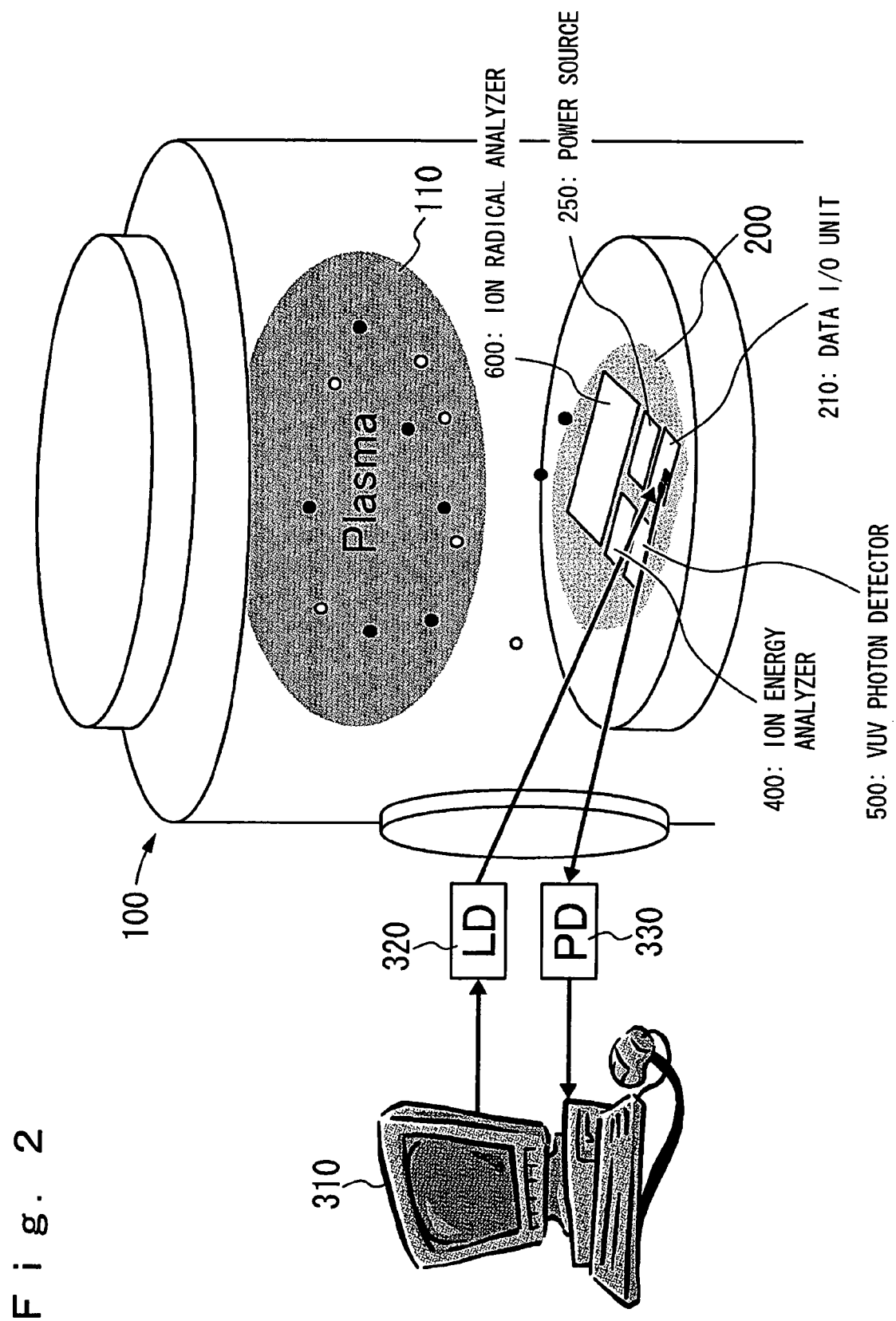
FIG. 2 is a view showing the schematic constitution of an on-wafer monitoring system of the present invention.
Figure 3:
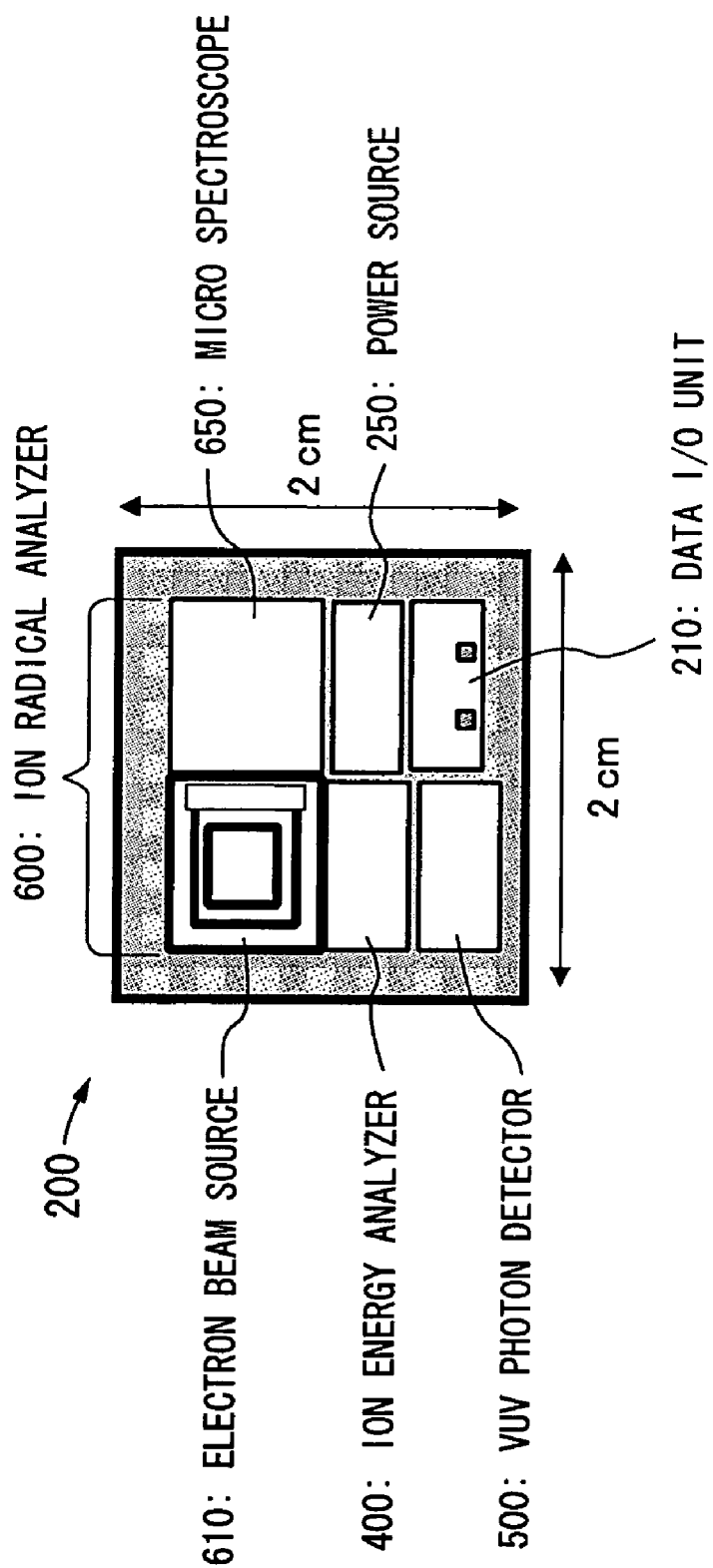
FIG. 3 is a view showing a constitution example of the on-wafer monitoring system on a wafer.

FIG. 2 and FIG. 3 show the basic structure of the on-wafer monitoring system according to the present invention.

FIG. 2 shows the on-wafer monitoring system 200 where sensors and the like are created on a substrate and placed on the position of a substrate to be treated in the plasma treatment device 100. The on-wafer monitoring system 200, as shown in FIG. 3, comprises various kinds of sensors which are created on the substrate, a data I/O unit 210 that inputs/outputs data from/to outside via light, and a power source unit 250 that supplies power source to them. The on-wafer data I/O unit 210 is connected to a laser diode (LD) 320 and a photo diode (PD) 330, which are I/O units via light installed outside, and it receives instructions from outside and transmits monitored data to the outside.

The on-wafer monitoring system 200 shown in FIG. 2 and FIG. 3 is an example where an ion energy analyzer 400, a VUV photon detector 500 and a radical ion species emission spectrophotometer 600 as sensors are provided on the substrate. The constitution of the sensors will be described in detail later.

As shown in FIG. 3, the measurement systems are integrated on an Si wafer, and measurement in various kinds of plasma process devices can be easily performed. FIG. 3 shows an example where a voltage driving system and a signal detection system were built by forming an electric circuit on the Si wafer, but a photo-detecting device and a light-emitting device are installed on the Si wafer and driving of the sensors and detection of signals can be also controlled from outside a vacuum equipment by using light. The feature of the present invention is to measure plasma process wirelessly by using micro sensors. Basically, the sensor section and the signal processing section of the on-wafer monitoring system are developed using micromachine technology and LSI technology, respectively.

The size of one chip is approximately 2 cm×2 cm, for example. A wafer size is 8 inches and 12 inches, ultimately. Further, the system is not a TEG (test element group) style, but is fabricated on an exclusive wafer and shall be capable of measuring all the distribution within a wafer plane.

As described, the ion energy analyzer, the probe based on the ion energy analyzer, the photon detector, and the ion species and radical species emission spectrophotometer are integrated with a lock-in amplifier, the photo diode, a memory circuit, a switching circuit, a filter circuit, and an LSI of I/O signal system, and a power source system is also fabricated into one chip. All data transmission/receiving is performed via optical interconnect and a complete wireless in-line system can be built.

Furthermore, as shown in FIG. 2, by transmitting acquired data wirelessly to a computer 310 using the on-wafer monitoring system, the process of plasma treatment can be simulated in real-time. In addition, prediction by the simulation is fed back to a plasma generator, and the process can be controlled during process.

<I/O Unit>

Optical interconnect technology by the photo diode (PD) is used for wireless transmission/receiving of signals.

FIGS. 4(*a*)-4(*b*) show a constitution example of the I/O unit. FIG. 4(*a*) shows a receiving section by photo diodes 212, 214. The photo diode 212 receives the instruction via optical signals from an outside photo diode (LD), and a difference is taken by the output from the photo diode 214 receiving background light and an operation amplifier 216. Then, a selective circuit 218 sends it to each sensor as an instruction.

As described, wireless communication between the outside and the on-wafer monitoring system 200 can be performed by optical signals.

<Power Source>

Incidentally, the power source 250 that supplies power to each kind of sensor is created on the substrate, and controls voltage by connecting to a voltage variable circuit utilizing potential (a few tens V to a few hundred V) generated by plasma in the plasma treatment device 100.

Figure 5:
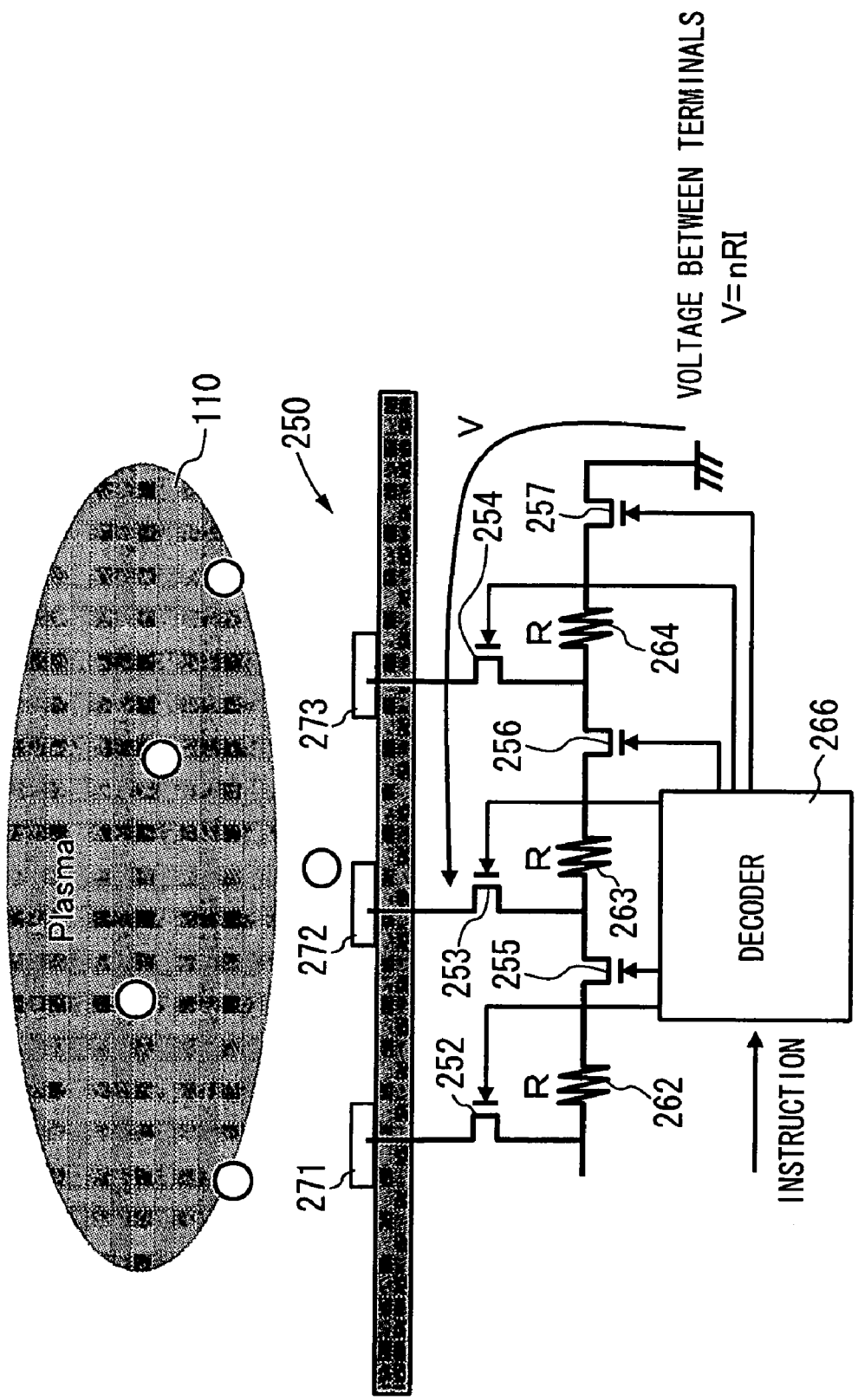
FIG. 5 is a view showing a constitution of a power source of the on-wafer monitoring system.

FIG. 5 shows a construction example of the power source unit 250. In FIG. 5, electrodes 271 to 273 receive a potential difference between plasma space potential and ground in the plasma 110. On receiving the potential difference, a decoder controls current that flows in transistors 252 to 254 and transistors 255 to 257, and thus obtaining desired voltage V=nRI. Note that R and n denote the resistance value of resistors 262 to 264 and the number of resistors, respectively.

Figure 6:
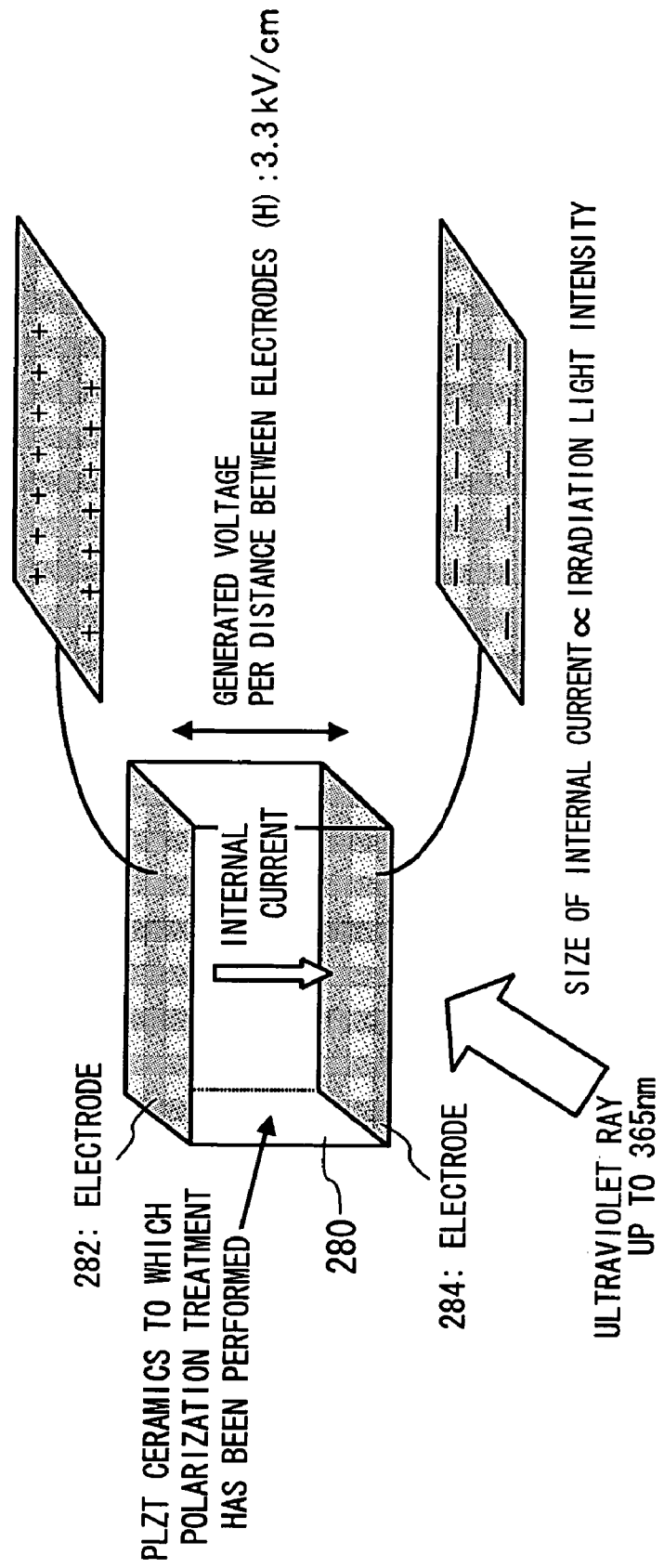
FIG. 6 is a view showing another constitution of the power source.

When higher voltage is required, a PLZT (Lead Lanthanum Zirconium Titanate) device is used. The device is capable of supplying voltage of approximately 3 kV/cm. Its example is shown in FIG. 6. In FIG. 6, when ultraviolet ray having a wavelength of 365 nm or higher is irradiated to the PLZT (Lead Lanthanum Zirconium Titanate) device 280 to which polarization treatment was performed, internal current corresponding to the irradiation light intensity flows, and the voltage of 3.3 kV/cm occurs between an electrode 282 and an electrode 284 depending on a distance between electrodes. As the ultraviolet ray to be used, ultraviolet ray from plasma or ultraviolet ray irradiated from outside is used. Consequently, a high-voltage power source can be installed inside the on-wafer monitoring system 200.

As described, the PLZT (Lead Lanthanum Zirconium Titanate) device, which is capable of taking out the potential generated on the wafer as shown in FIG. 5 or capable of generating high voltage by ultraviolet ray irradiation as shown in FIG. 6, can be used in the power source supplied to the on-wafer monitoring system 200.

<On-wafer Ion Energy Analyzer>

Figure 7:
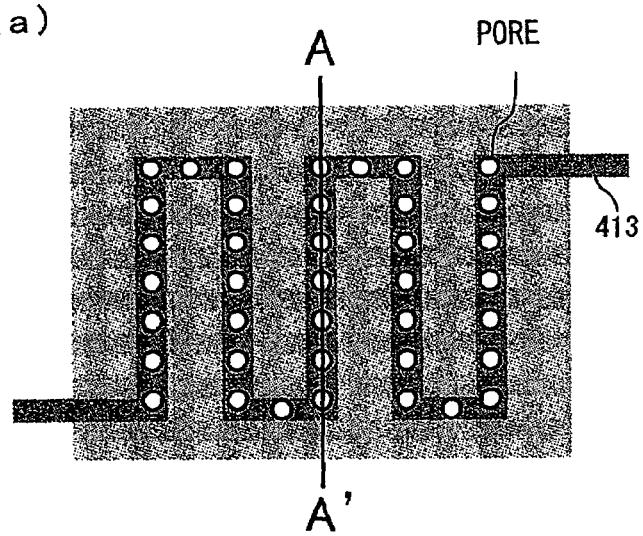
FIGS. 7(*a*)-7(*b*) are views showing a constitution of an on-wafer ion energy analyzer.
Figure 7:
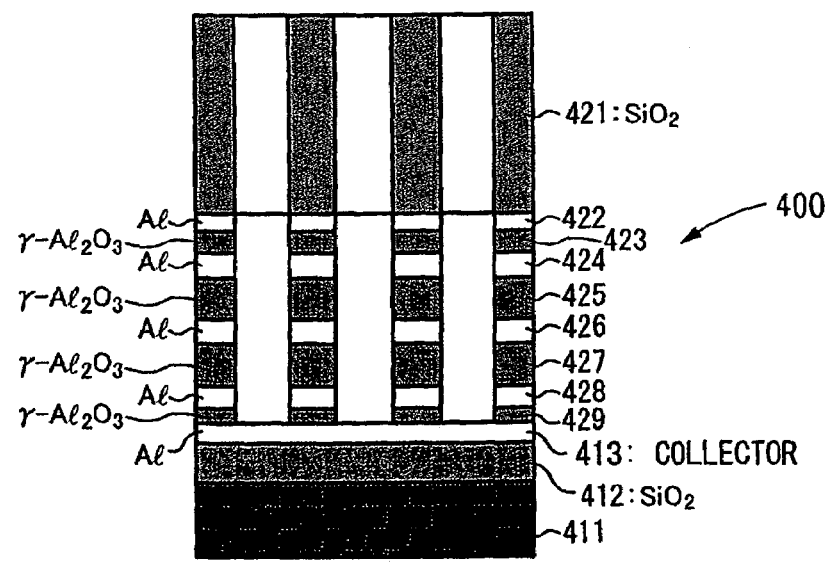

Firstly, as an example of sensors mounted on the on-wafer monitoring system 200, description will be made for the constitution of the ion energy analyzer by using FIGS. 7(a)-7(b) and FIG. 8. FIG. 7(a) is a plan view seen from above, and FIG. 7(b) is a sectional view of FIG. 7(a) cut at A-A'. An area having a pattern size corresponding to the semiconductor device ($SiO_2$ 421 in the drawing) and a collector electrode 413 in a layer under an analyzing device area of FIG. 7(b) make a structure where they are formed in a zigzag linear state as shown in FIG. 7(a). FIG. 8 shows the constitution of the entire measurement system using the electrodes and the like shown in FIGS. 7(a)-7(b).

If predetermined pores (100 nm, for example) are only formed in the analyzing device area in order to include the pattern area ($SiO_2$ 421) corresponding to the semiconductor device and the analyzing device area individually, a pore diameter and a depth of the analyzing device can be freely designed to the order of a few μm. The disturbance to a surface sheath and plasma can be prevented by making the pattern size smaller than a device length.

The ion energy analyzer is required to be capable of measuring voltage and current characteristics in a high-aspect pattern. Therefore, as shown in FIGS. 7(a)-7(b), an electrode to which voltage is applied is embedded under the pattern of the $SiO_2$ layer 421 that is a plasma treatment object. Since voltage to be applied is as extremely high as up to 1 kV on the assumption of silicon oxide film etching, an insulating film material requires high withstanding voltage. Thus, selection of material is quite important. In the present circumstances, $Al_2O_3$ that is anodized aluminum should be used.

An electrode for electron-retarding voltage application 424, an electrode for ion energy separation voltage 426, and an electrode for removing secondary electrons 428 are arranged on a sidewall electrode. As shown in FIG. 8, blocking voltage to inflow electrons $V_1$ 462, voltage for separating ion energy $V_2$ 464, and voltage for removing secondary electrons $V_3$ 466 are applied to each electrode. Further, the uppermost (directly under the $SiO_2$ layer 421) sidewall electrode 422 is directly connected to an Si layer 411 into a same potential as shown in FIG. 8. This is because the Si layer 411 is under the $SiO_2$ layer 421 in a regular plasma etching treatment, and the connection is made in order to realize it in this sensor in a simulated manner.

By properly setting the voltage of each electrode, electron current/energy and ion current/energy, which are made incident to the etching pattern ($SiO_2$ layer 421 in FIG. 7(b)) can be measured, and in addition, charged particles such as electrons and ions are removed and neutral particles and photons can be taken out from the incident particles.

In the ion energy analyzer or the like, high voltage of a few hundred V or higher must be applied to micro regions to separate incident ion energy, and $Al_2O_3$ having high withstanding voltage is used for the insulating film. An aluminum electrode surface to which voltage is applied is covered with a thin oxide film, and has a structure that is not affected by deposit of polymers or the like.

In the ion energy analyzer 400, as shown in FIG. 8, synchronized voltage of linearly increasing voltage and voltage having constant frequency from a frequency generator 452 is applied as the voltage for separating ion energy $V_2$ 464. Then, to measure micro ion current flowing in a collector electrode 413, noise is removed using a lock-in amplifier 454 to measure voltage and ion current characteristic regarding the noise from plasma. The value is differentiated to calculate the ion energy distribution.

Each electrode is separated by the insulating material, and γ-$Al_2O_3$ having high withstanding voltage used as a barrier film of an electrolytic capacitor is used as the insulating material between the electrodes in the present invention. Another insulating material (such as $SiO_2$ and another ceramic material) may be used according to the energy of charged particles to be measured. Further, the number of electrodes for generating blocking electric field may be decreased depending on a measurement type and required measurement accuracy.

There are cases where deposit is formed on the structure during actual plasma process, and the fluctuation of the blocking electric field caused by the deposit is a problem. For example, when performing etching to $SiO_2$, an organic material having a structure similar to Teflon could deposit on the sidewall electrode when the etching is performed by using C—F series gas. In the present invention, a film having sufficient capacity ($Al_2O_3$, for example) is formed on the electrode surface exposed on the sidewall to restrict affects of the deposit to measurement.

The disturbance to the surface sheath and plasma can be restricted almost completely by making the pattern size smaller than the device length and making the potential of a sensor surface the same as the substrate.

The lock-in amplifier is used for noise, and a method where the noise is removed and the ion current is measured is used. Although it is possible to form a lock-in amplifier circuit in the substrate as described above, the optical interconnect is used to transmit the signals to the outside and the lock-in amplifier may be installed outside.

The above-described on-wafer ion energy analyzer 400 is capable of measuring the distribution of the ion energy made incident to the pore structure, which is formed in the patterns of the $SiO_2$ layer, without being affected by the noise from plasma and deposited film.

The structure of the ion energy analyzer is formed on the Si wafer by applying semiconductor device manufacturing technology. FIGS. 9(a)-9(c) and FIGS. 10(d)-10(f) are one example of the manufacturing process.

Figure 9A:
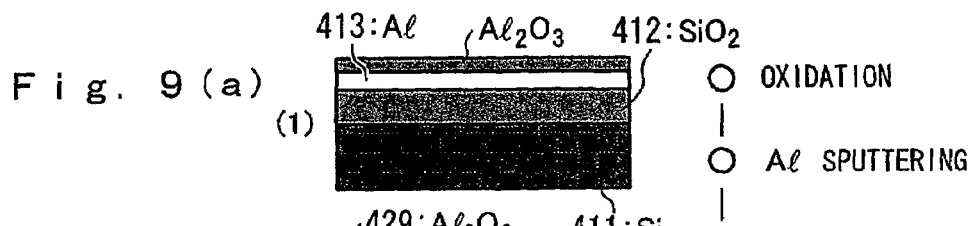
FIGS. 9(*a*)-9(*c*) are views showing a manufacturing process of the ion energy analyzer.

In FIG. 9(a)(1), after oxidizing the silicon substrate 411 to form the oxide film 412 on the substrate and depositing aluminum, patterning is performed in the zigzag linear state, for example, as shown in FIG. 7(a) to form an aluminum electrode (collector electrode 413). Next, anodization is performed to form a γ-$Al_2O_3$ layer on the aluminum layer and RIE (reactive ion etching) is performed to the $Al_2O_3$ layer formed, and thus pores are formed (refer to FIG. 9(a)(2)).

Figure 9B:
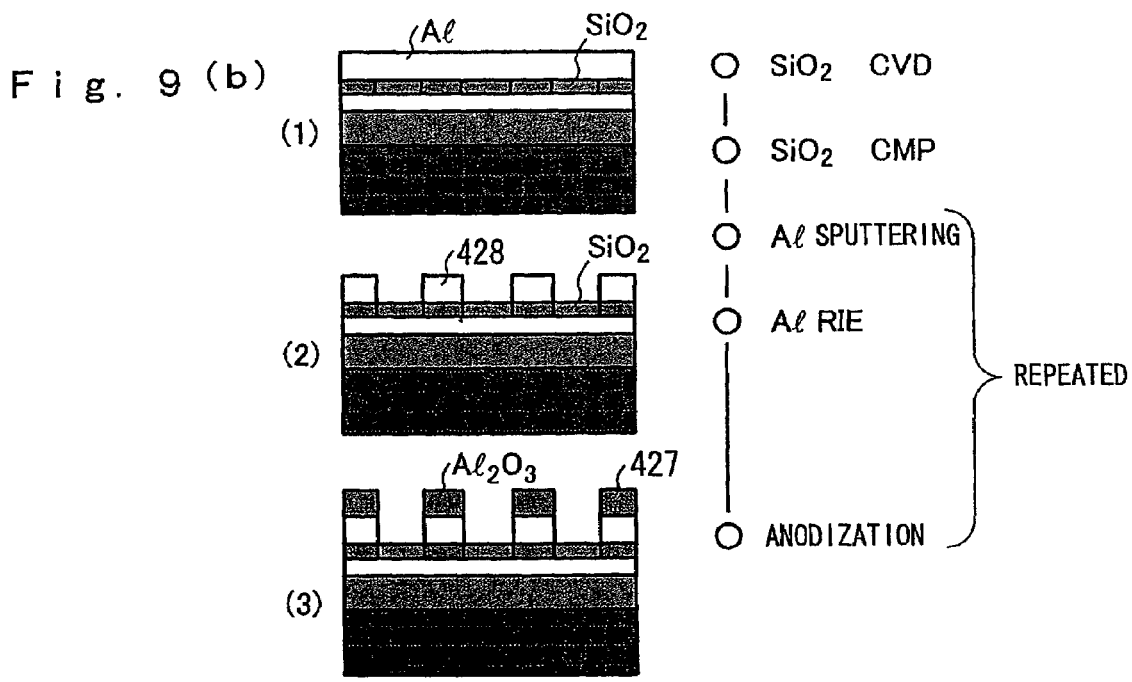

As shown in FIGS. 9(b)(1) to (3), the $SiO_2$ layer is formed by CVD (chemical vapor deposition) on the Al layer 413 of the collector electrode for protection purpose, CMP (chemical mechanical polishing) is conducted to the formed $SiO_2$ layer to make it flat with the γ-$Al_2O_3$ layer. Aluminum is sputtered on it to form an electrode. Then, after performing RIE to the electrode to form the pores, anodization is conducted to form a γ-$Al_2O_3$ layer 427. In conducting the anodization, the $Al_2O_3$ layer is formed on areas that are exposed to the side surface of the aluminum electrode.

Figure 9C:
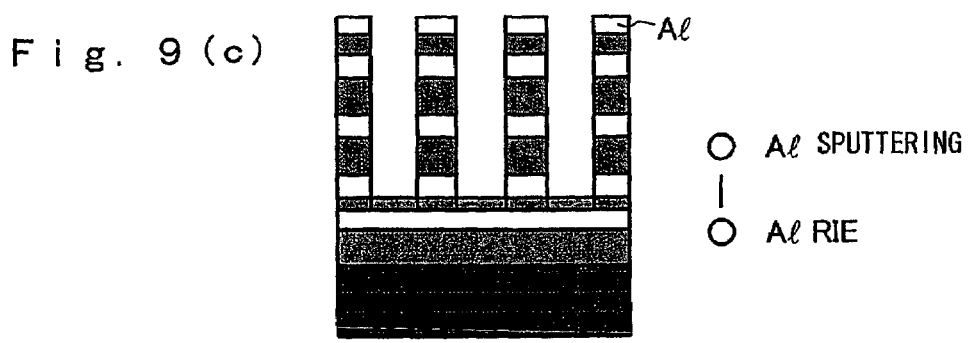

Subsequently, the sputtering of the aluminum electrode on the γ-$Al_2O_3$ layer, the formation of pores by RIE, and the formation of the γ-$Al_2O_3$ layer by anodization are repeated for plural times (twice in the drawing), and the sputtering of the aluminum electrode and the formation of pores by RIE are finally performed, which is shown in FIG. 9(c).

Figure 10D:
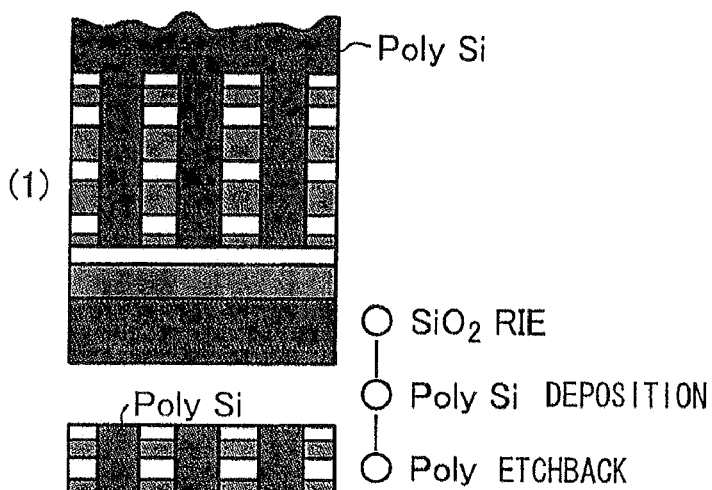
FIGS. 10(*d*)-10(*f*) are views showing a continued manufacturing process of the ion energy analyzer.
Figure 10E:
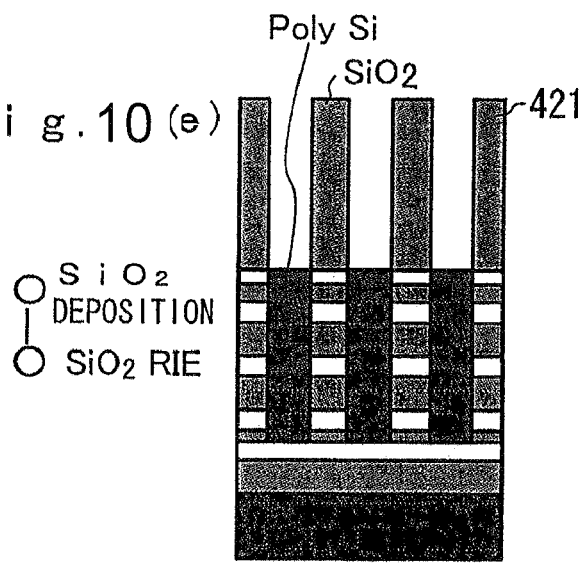
Figure 10F:
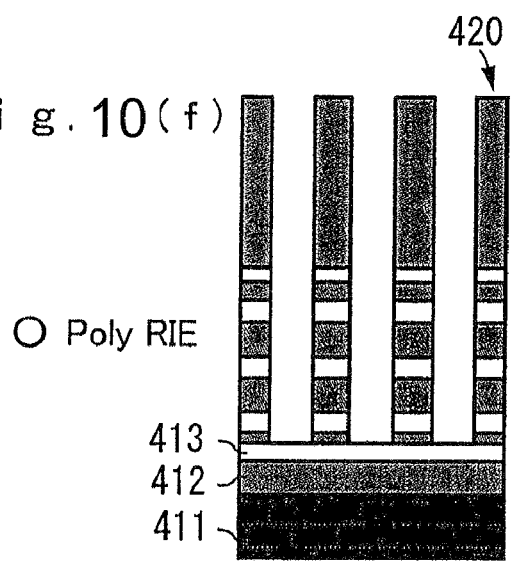

Next, as shown in FIG. 10(d)(1), the SiO$_2$ layer for protection that has been previously formed by CVD, is removed by RIE, and then, polycrystalline silicon is formed including the inside of pores. Then, the polycrystalline silicon is etched back for planarization (refer to FIG. 10(d)(2)). Then, as shown in FIG. 10(d), an SiO$_2$ layer is formed on a planarized plane and pores are formed on the formed SiO$_2$ layer by RIE. Eventually, the polycrystalline silicon is removed by RIE to allow the pore pass completely through the collector electrode 413 (refer to FIG. 10(f)).

As described, the ion energy analyzer can be formed on the Si wafer by applying the semiconductor device manufacturing technology.

<On-wafer Photon Detector>

The on-wafer photon detector detects the intensity and the wavelength of light such as vacuum ultraviolet ray (VUV), which is made incident into the patterns, by converting them into the photoinduced current generated in the insulating film such as a silicon oxide film, a silicon nitride film and a silicon oxynitride film. It can detect light having energy exceeding the energy band gap of each material. For example, the silicon oxide film has 8.8 eV by which vacuum ultraviolet ray can be measured. The silicon nitride film has 5 eV and the silicon oxynitride film has a value between the previous values.

Furthermore, when a metal thin film of approximately 1 μm is placed on the insulating film, it transmits only light exceeding plasma frequency determined by the electron density in the metal. Further, by making the metal film extremely thin, it also transmits wavelength same as plasma frequency or less. At this point, light corresponding to an energy difference between the work function of metal and the conduction band bottom of the insulating film is absorbed at the interface between the metal film and the insulating film of the metal, and electron carriers are generated in an insulating film conduction band, that is, the photoinduced current is generated. Thus, it is possible to detect light having a particular wavelength. By changing the type and the film thickness of the metal, intrinsic plasma frequency or work function can be changed. By changing the type and film thickness of the insulating film, intrinsic band gap can be changed. Consequently, by combining insulating film materials, metals, and semiconductors (Si), light of various wavelengths can be detected. Furthermore, voltage for retarding electrons and ions is applied to make only emitted light incident into the pattern, and measurement can be done, and electrons and ions can be removed by depositing the metal film on the insulating film as well.

Figure 11A:
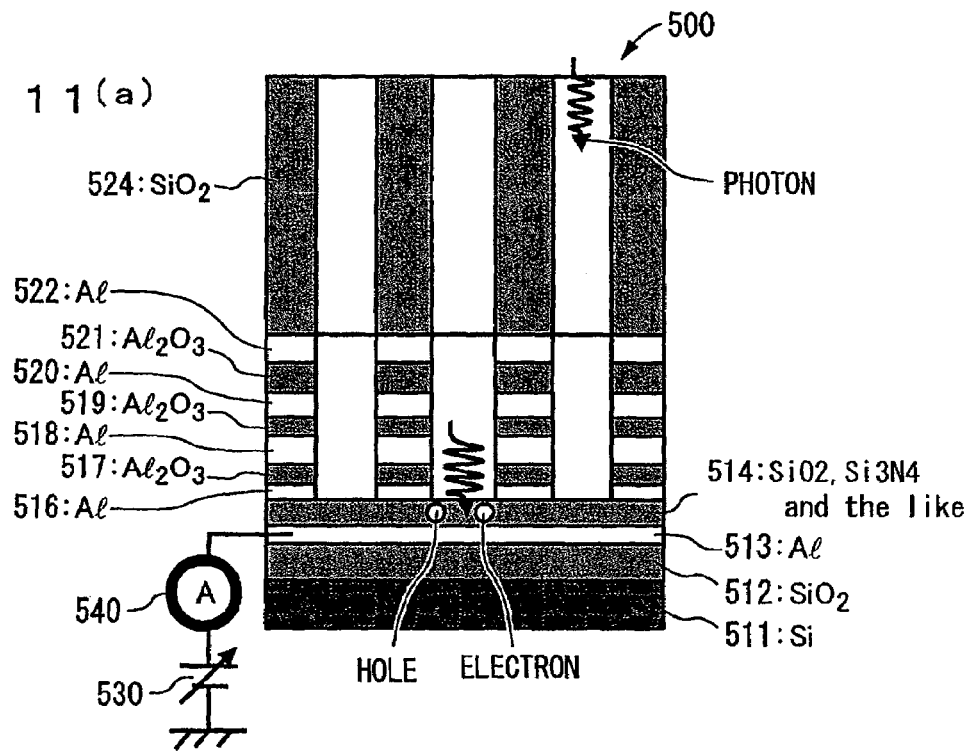
FIGS. 11(*a*)-11(*b*) are views showing a constitution of a photon detector.

FIG. 11(a) shows the constitution of a photon detector 500. Although its constitution is basically the same as that of the ion energy analyzer 400 shown in FIG. 8, and the surface of an electrode 513 at the bottom is covered by an SiO$_2$ film 514 as shown in FIG. 11(a). As described, the silicon oxide film 514 may be the insulating film such as the silicon nitride film and the silicon oxynitride film, and it can identify the wavelength of light detected by the type and the thickness of the insulating film. In the insulating film 514, the absorbance to the wavelength of light is known and the film is installed while the film thickness is controlled. The collector electrode 513 collects and measures the photoinduced current generated in the insulating film 514, and thus photons are measured. By monitoring the current flowing in the collector electrode 513, information regarding the wavelength of light that is made incident into the pattern can be obtained.

Figure 11B:
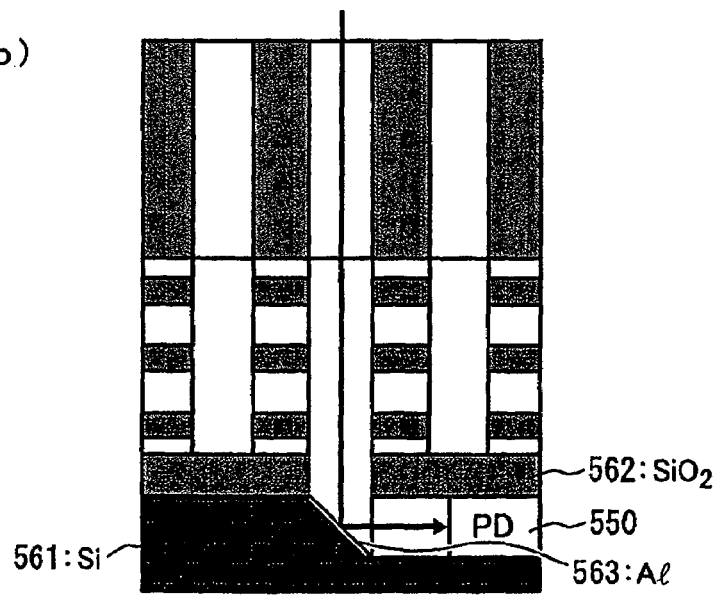

Furthermore, as shown in FIG. 11(b), a constitution is acceptable where a mirror 563 processed into the angle of 45 degrees is formed on an Si substrate 561 instead of the collector electrode, only incident light is reflected, and a photo diode 550 measures the incident light intensity.

In the photon detector 500 of FIGS. 11(a) and 11(b), the same voltage as in the ion energy analyzer shown in FIG. 8 is applied to each electrode to prevent electrons and ion from reaching the collector electrode and the like. In addition, the forming method is the same as FIGS. 9(a)-9(c) and FIGS. 10(d)-10(f).

<On-wafer Radical Ion Species Emission Spectrophotometer>

The on-wafer radical ion species emission spectrophotometer is used instead of the mass spectrometer in order to identify ions and radical species which are made incident to the substrate. The mass spectrometer requires a certain amount of distance to separate mass, and it is difficult to fabricate it on the silicon substrate. Further, loss or various reactions could occur because of long-range transportation and measurement of good accuracy is difficult. For this reason, the emission spectrophotometer, by which identification of ion species and radical species in micro regions are realized and which uses a micro electron gun that can cope with microfabrication and integration, has been developed.

Figure 12:
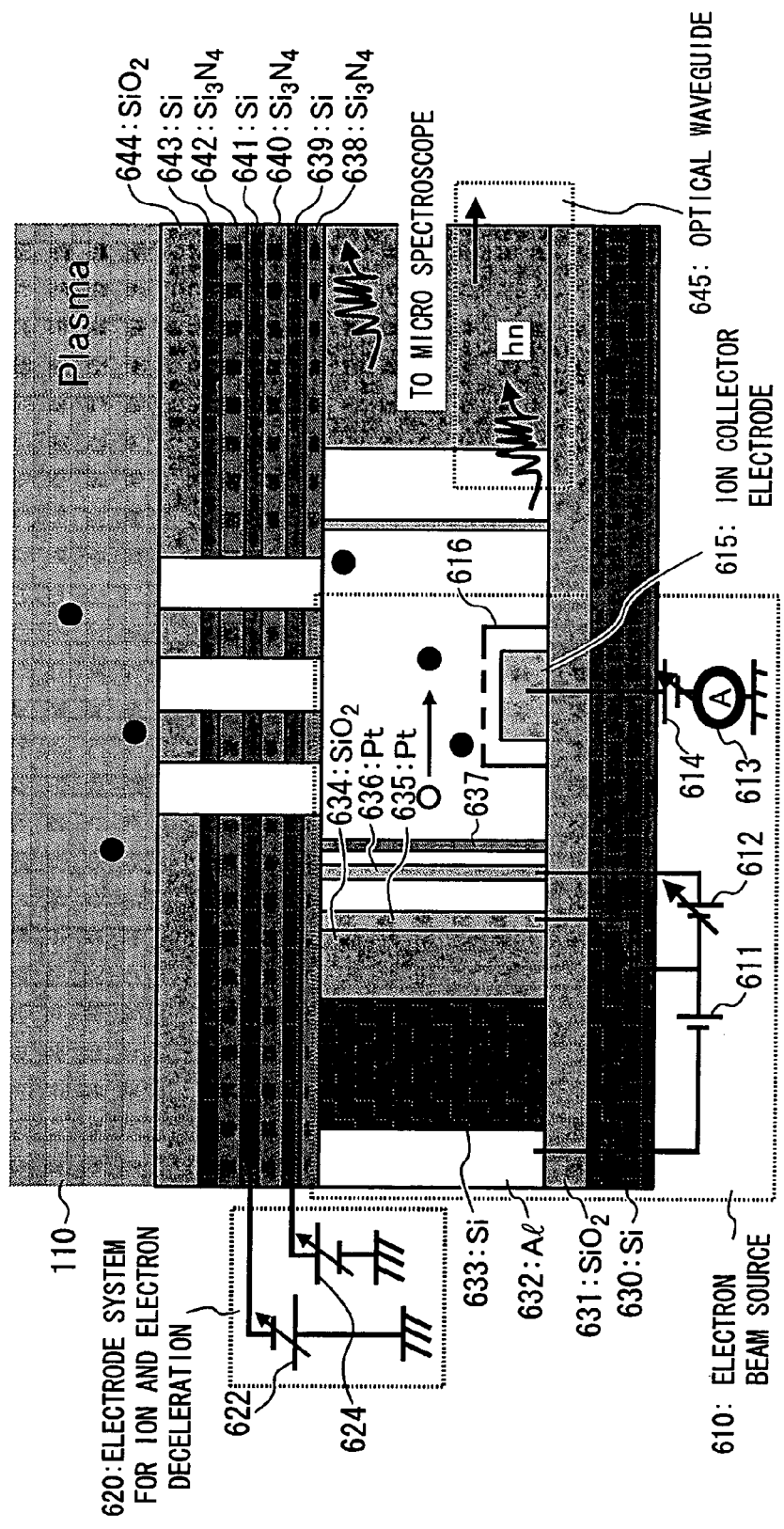
FIG. 12 is a view showing a constitution of an ion radical analyzer.

The on-wafer radical ion species emission spectrophotometer 600 shown in FIG. 12 separates ions, electrons and radicals, which are made incident to a pattern 644, by using the same electrode structure (638 to 644) as the ones used in the above-described ion energy analyzer. Voltage for blocking electrons 622 and voltage blocking ions 624 are applied to the electrodes. Note that the electron structure used here is constituted by silicon and silicon nitride, but Al and Al$_2$O$_3$ may be used in the same manner as FIG. 7(b).

Incident radicals and ions emit light by an energy variable electron beam generated by a micro electron gun 610, and the light emission is propagated to the micro spectroscope for spectroscopy. An optical waveguide 645 is used for propagating the light emission to the spectroscope. The spectroscope can perform spectroscopy with the resolution of 20 nm or less.

Further, it is constituted that an ion collector electrode 615 simultaneously measures ionization potential of radicals by the electron beam and identification of radicals or the like can be performed with the light emission spectroscopy. Herein, voltage of a power source 614 is changed, applied voltage to the ion collector electrode 615 is changed to measure voltage-current characteristics, appearance potential intrinsic to neutral particles is calculated, and thus emission of radicals can be detected.

In the emission spectroscope detecting ion species and radical species, an electron beam source to allow ions and radicals to emit light is manufactured by using a micro field emission type electron gun. Its description will be made using FIG. 13 and FIGS. 14(a)-14(b).

Figure 13:
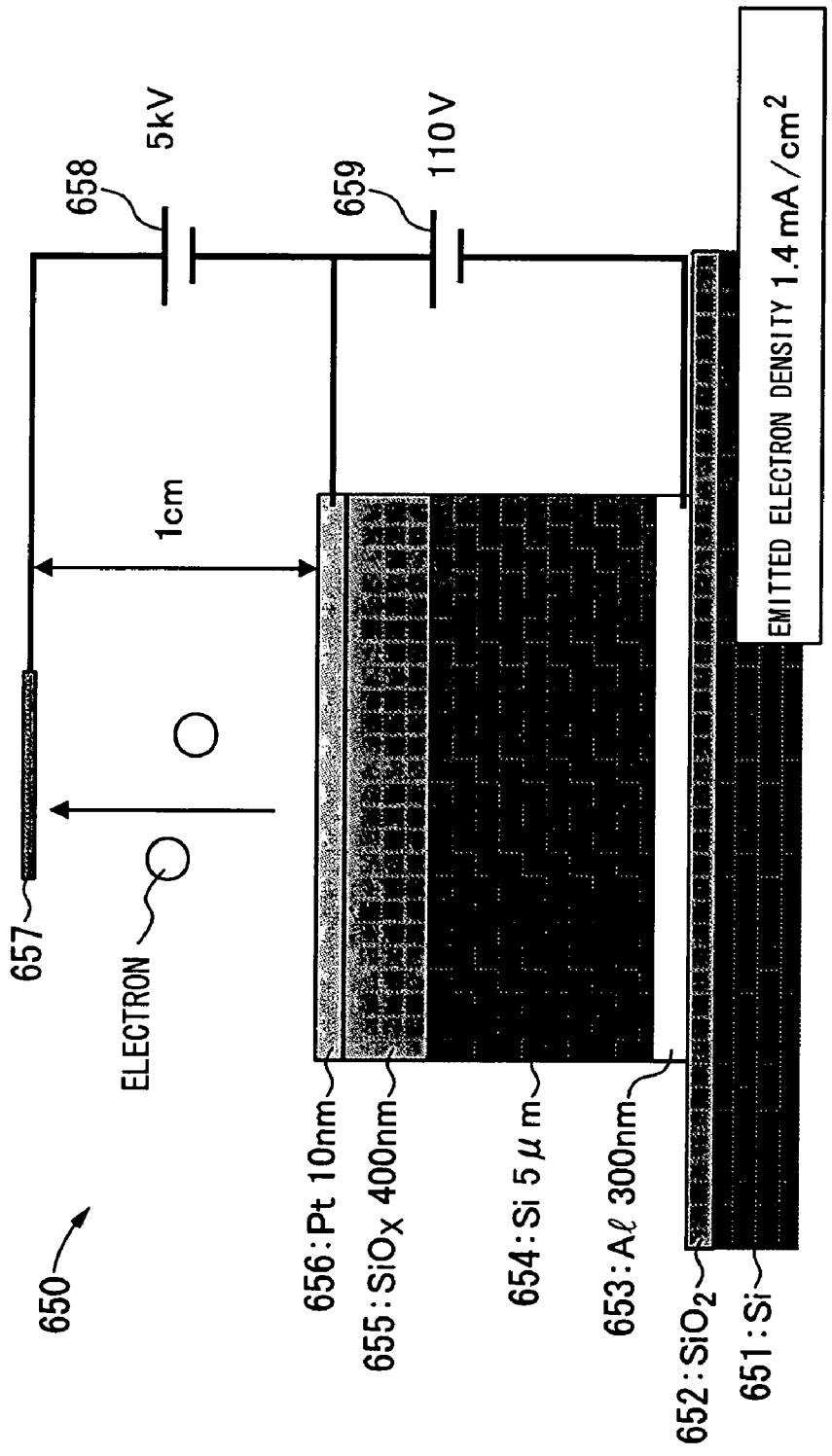
FIG. 13 is a view showing a basic constitution of an electron gun.

FIG. 13 is the field emission type electron gun described in the thesis (JJAP 36 (1997) L939). In the electron gun, an aluminum electrode is provided on an oxide film 652 on a silicon substrate 651. A silicon layer 654 and a silicon oxide film 655 are provided on it and a platinum electrode 656 is created. Further, an electrode 657 for applying electric field to emit electrons is provided 1 cm above the platinum electrode 656. When the voltage of 110V and the voltage of 5 kV are applied between the aluminum electrode 653 and the platinum electrode 656 and between the platinum electrode 656 and the electrode 657 above it, respectively, emitted electron density of 1.4 mA/cm$^2$ is obtained.

Meanwhile, the expression of Fowler-Nordheim regarding field emission type electron current depends on work function φ[eV] and field intensity F[Vcm$^{-1}$], and the following holds with respect to current density $J_0$.

$$J_0 = \frac{1.54 \times 10^{-6} F^2}{\phi} \exp\left\{\frac{-6.83 \times 10^7 \phi^{3/2}}{F}\right\} [A \cdot cm^{-2}] \quad \text{[Expression 1]}$$

Herein, supposing the gap between electrodes is 1 cm and the applied voltage is 5 kV, the field intensity is 5×10$^3$[V/cm]. When it is microfabricated to set the gap between electrodes to 1/1000, 5V should be applied to obtain the same field intensity.

Figure 14A:
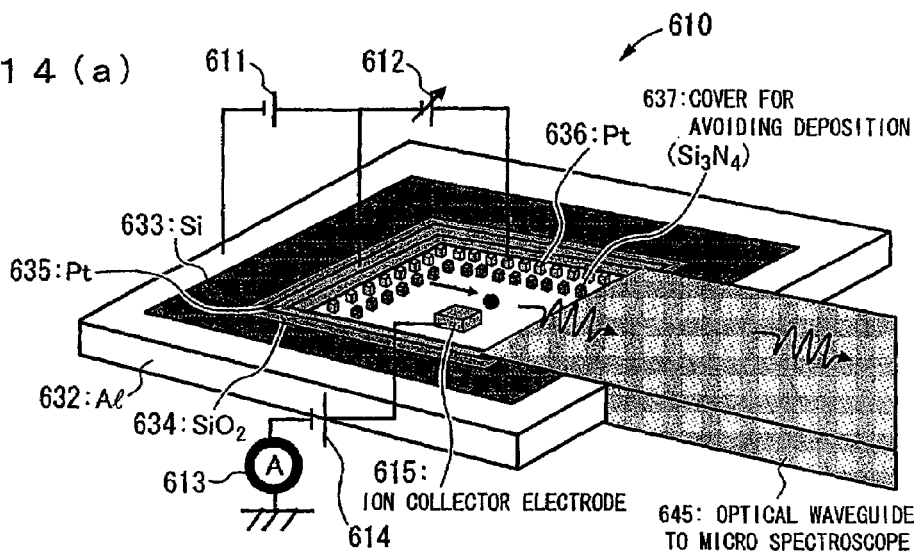
FIGS. 14(*a*)-14(*b*) are views showing a constitution of the electron gun used in the ion radical analyzer.
Figure 14B:
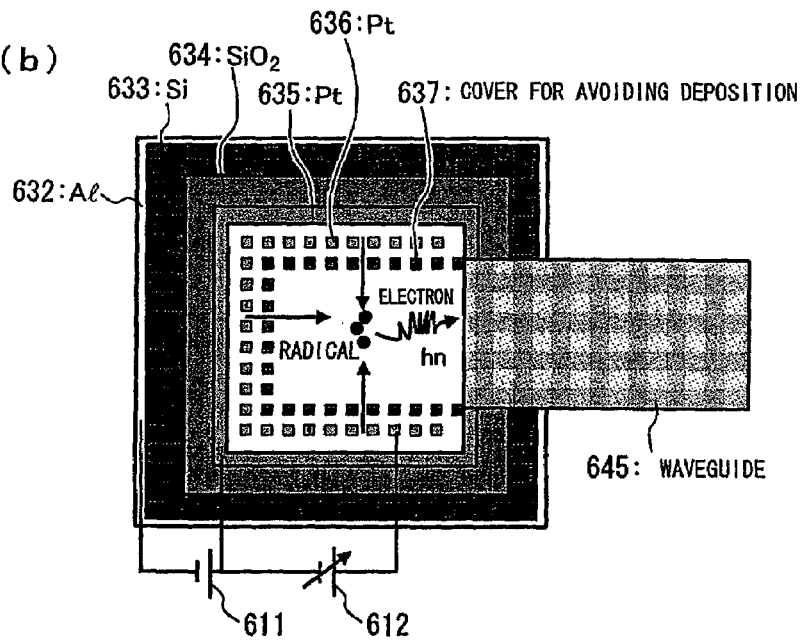

This is realized into the electron gun shown in FIGS. 14(a)-14(b). FIG. 14(a) is a perspective view and FIG. 14(b) is a plan view seen from above. With the same construction as FIG. 13, an aluminum electrode 632, a silicon layer 633, and SiO$_2$ layer 634, a platinum electrode 635 and a platinum electrode 636 constitute the electron gun. A cover 616 (shown in FIG. 12) for the electrode 615 and a cover for avoiding deposition 637 are formed by Si$_3$N$_4$, which prevents deposit from attaching to the electrode 615 and the platinum electrode 635.

Light emission by the electron gun is propagated by the waveguide 645, where an SiON film is sandwiched by SiO$_2$ films or Mg is doped on the surface of SiO$_2$, and a micro spectroscope 650 performs spectroscopic diffraction.

Figures 15, 15A, 15B:
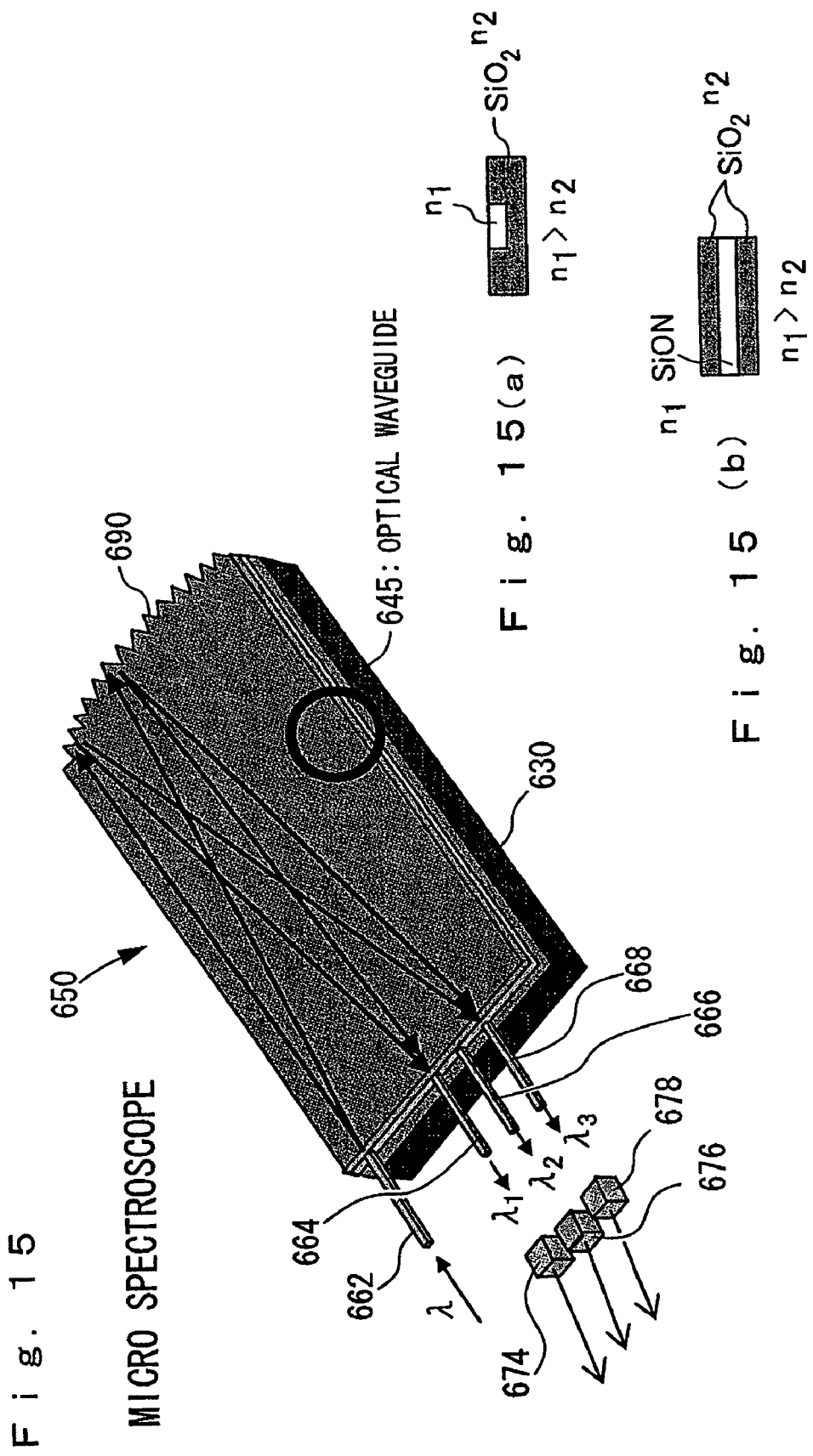
FIGS. 15 and 15(*a*)-15(*b*) are views showing a constitution of a micro spectroscope.

FIGS. 15 and 15(a)-15(b) describe the construction of the micro spectroscope 650. As shown in FIG. 15, input light is reflected by a blazed grating 690 that is processed into a saw-tooth shape, for example, which is provided on the optical waveguide, the light is spectrally factorized into wavelengths $\lambda_1$ to $\lambda_3$, and photo-detecting device 674 to 678 detects them. As described, the micro spectroscope 650 is constituted by forming a diffraction device by a semiconductor device. The optical waveguide is formed in such a manner that an (n$_1$) layer having high refractive index in an (n$_2$) layer having low refractive index as shown in (a), or the (n$_1$) layer having high refractive index is sandwiched by the (n$_2$) layers having low refractive index as shown in (b). To form the layers having different refractive index, the layer having low refractive index is fabricated in the SiO$_2$ layer by iondoping or the waveguide may be formed by polyimide.

By using the micro spectroscope, even micro light is detected at high sensitivity. In the case of radicals, appearance potential is monitored by observing current values ionized simultaneously. The individual micro sensor technology is integrated.

An example of the manufacturing process of the on-wafer radical ion species emission spectrophotometer 600 will be described using FIGS. 16(a)-16(f) and FIGS. 17(g)-17(k).

In FIG. 16(a), an oxide film 631 is formed on a silicon substrate 630. Silicon is deposited on the oxide film 631 and etching is performed to form an Si layer 633 (refer to FIG. 16(b)). Vapor deposition of aluminum is performed to the Si layer 633 to form the electrode 632 (refer to FIG. 16(c)). Further, SiO$_2$ is deposited on the Si layer 633 and etching is performed to form the SiO$_2$ layer 634 (refer to FIG. 16(d)).

Next, as shown in FIG. 16(e), platinum is deposited and patterning is performed to form the electrode 635 and the electrode 636. Then, by depositing Si$_3$N$_4$ and performing etching, the covers 637, 616 protecting the electrodes are formed (refer to FIG. 16(f)).

As shown in FIGS. 17(g), (h), SiO$_2$ (including a sacrifice layer) is deposited and etching is performed, Si$_3$N$_4$ is deposited on the formed SiO$_2$ and etching is performed, and thus completing the cover 616 for the electrode 615. Next, to fabricate the waveguide 645, SiO$_2$ is deposited and performing etching, ion doping is conducted (refer to FIG. 17(i)).

As shown in FIGS. 17(j) and (k), to form an electrode for blocking electrons and ions from plasma, after Si$_3$N$_4$ is deposited and etching is performed, the sacrifice layer of SiO$_2$ that was used in forming the electrode is also removed by etching. Note that, in FIGS. 17(j) and (k), the SiO$_2$ layer 644 and the electrode Si 643 are also formed, for example, as pattern layers, as shown in FIG. 12.

Figure 18:
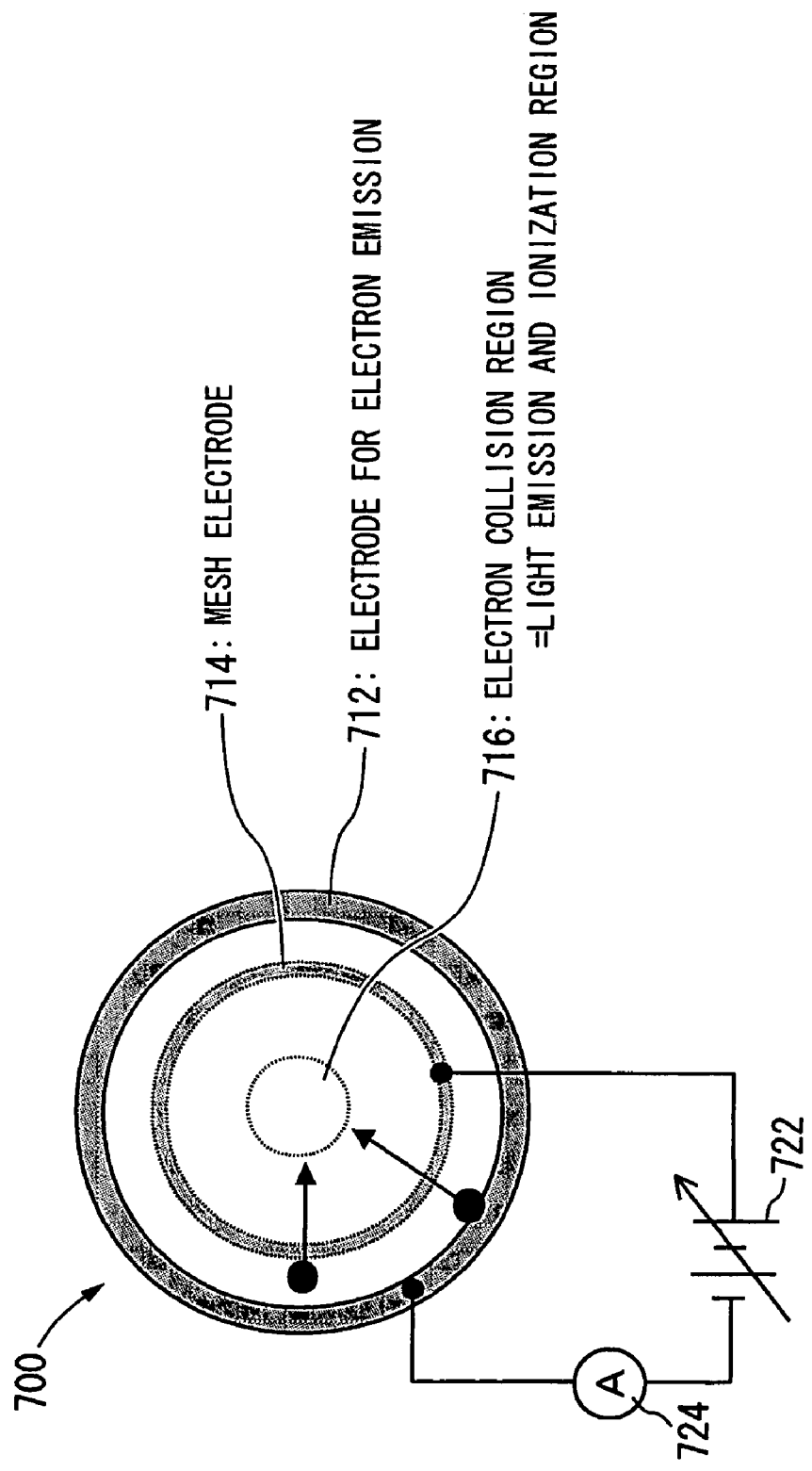
FIG. 18 is a view showing another constitution of the electron gun.

FIG. 18 shows another constitution of the electron gun. Although FIGS. 14(a)-14(b) illustrate a constitution where electrons are emitted from three sides of a square and the waveguide 645 is installed on one side, its shape may be a circular shape as shown in FIG. 18. In FIG. 18, by applying voltage to an electrode for electron emission 712 and a mesh electrode 714, which are concentric circles, electrons emitted from the electron gun can be focused on a specified region (central area of the concentric circles) 716.

Figure 19:
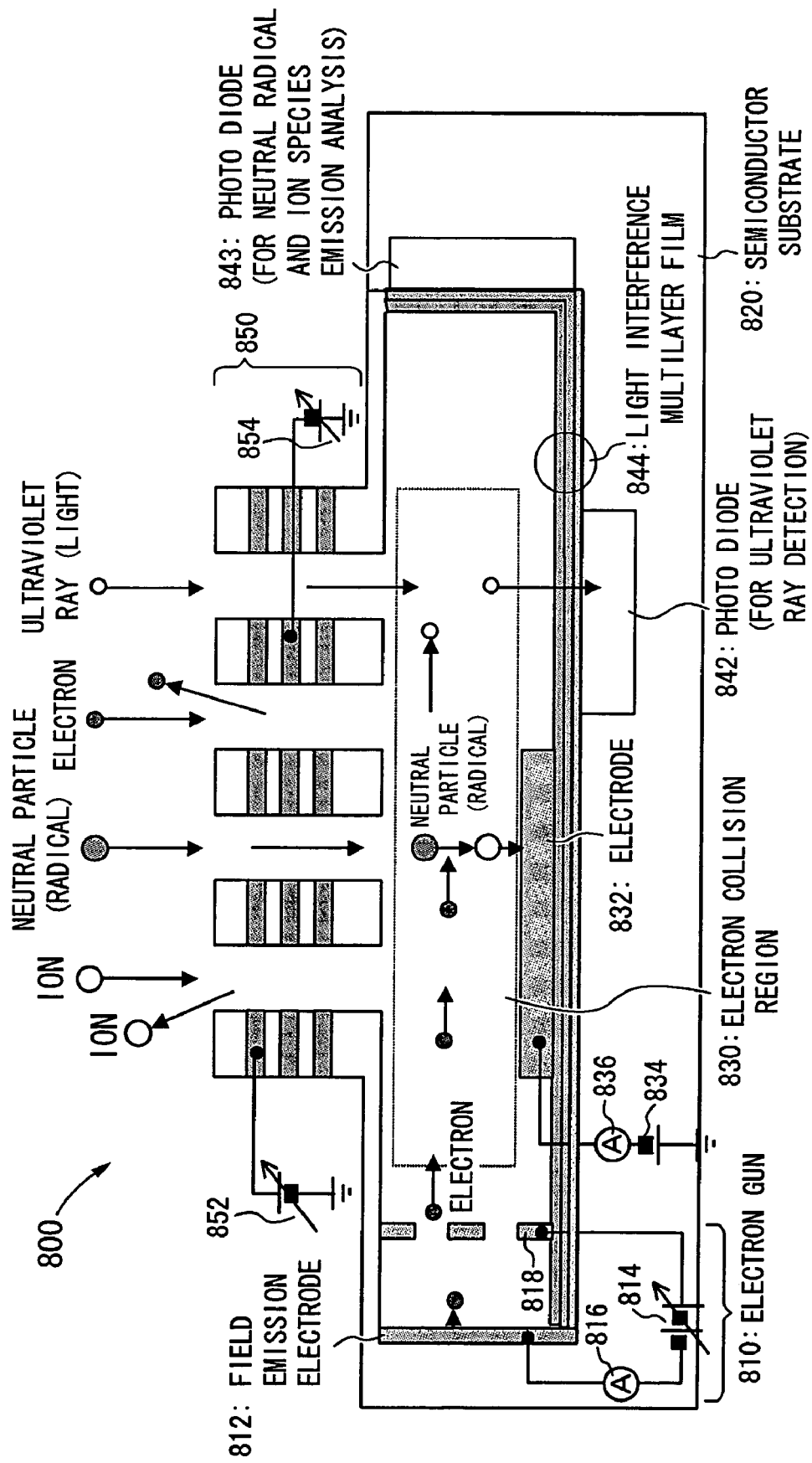
FIG. 19 is a view showing another schematic constitution of the ion radical analyzer.

Further, FIG. 19 shows the outline of the ion radical analyzer that is an ion radical analyzer using a constitution, where a light interference multilayer film and a photo diode are combined, is used as an analyzer for observing light emission from the electron gun. In the outline constitution shown in the drawing, light emission of neutral particles or the like by electron collision is detected by a narrow-band transmission optical filter 844 constituted by the light interference multilayer film and a photo diode 843. As an electron gun 810 of the constitution of this ion radical analyzer, it is suitable to use the electron gun constitution shown in FIG. 18. Note that a photo diode 842 constitutes a photon detector detecting light such as ultraviolet ray and the like that transmit the light interference multilayer thin film 844.

<On-wafer Probe>

Figure 20:
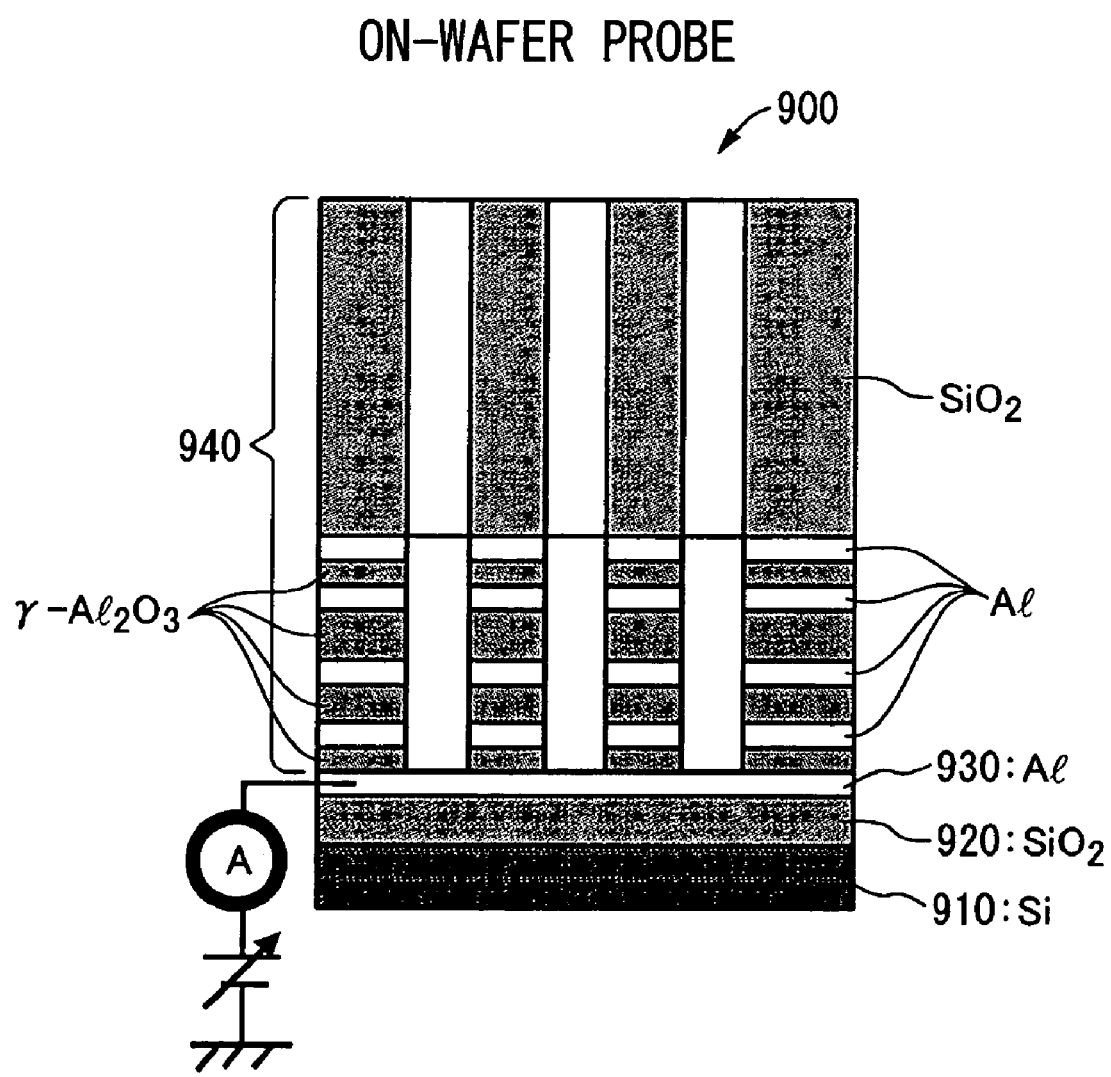
FIG. 20 is a view showing the constitution of a micro probe.

The on-wafer probe, as shown in FIG. 20, has basically the same structure as the ion energy analyzer shown in FIG. 7(b), where a collector as the bottom electrode performs voltage and current measurement. It is a micro probe capable of measuring electron current entered into etching patterns, electron energy distribution, ion current, electron temperature, electron density, charge storage amount, and the like by controlling voltage and the like applied to each electrode. It can be mounted as a sensor of the on-wafer monitoring system.

<Other Application>

After exposing the sensor structure shown in FIG. 7(b) and FIG. 20 to plasma, constant voltage is applied between each electrode to measure the current flowing between the electrodes, by which aspect dependence of sidewall conductivity can be easily measured.

Further, after each electrode is connected to the control electrode of a flash memory and exposed to plasma, charge accumulated in a floating electrode is measured as V$_{th}$ shift of a control electrode, the depth dependence of an electric charge by plasma process can be evaluated at one time.

<Affects by Deposition>

The plasma on-wafer monitoring is primarily on the assumption of plasma etching process. Particularly, it is believed that deposition of polymers or the like during silicon oxide film etching affects monitoring. Consequently, the present invention is designed to restrict the affects of a polymer deposition film at a minimum level. In the ion energy analyzer, since voltage is applied to the sidewall to perform electron retarding and energy separation of ions, the polymer deposition on the sidewall cause affects. Thus, by covering the sidewall electrode surface with a thin insulating film, it is possible to create a state where the capacity of sidewall changes little in spite of the deposition of polymers or the like, and voltage fluctuation or the like can be restricted.

Further, because high-energy ions constantly make an impact to the ion collector electrode area at a contact hole bottom, the deposition of polymers is extremely small, but it is required to implement a sequence that high voltage is applied to the bottom after measurement and the surface is cleaned by Ar ions or oxygen ions to improve reliability and to lengthen the number of repeated use. The affects of the deposited film can be also restricted for the probe and the photon detector by the same method. On the other hand, regarding the ion species and radical species emission spectrophotometer, it is possible for an incident ion lens system to restrict the affects of the deposited film or the like by the same design as the ion energy analyzer.

The micro electron gun, the optical waveguide and the micro spectroscope are devised to prevent radicals from reaching them by installing a nitride film slit for covering the electron gun or devising layout.

<Measures to Disturbance of Ion Sheath by Devices, Increase of Devices Temperature, and Electromagnetic Noise>

The disturbance of the ion sheath by devices can be prevented by bringing the electrode on the substrate surface and the silicon substrate into the same potential. Further, the increase of devices temperature can be sufficiently restricted by substrate cooling of an etching apparatus, because all sensors are fabricated inside the silicon substrate with the size on the order of μm. The electromagnetic noise can be solved by fabricating the circuit of the lock-in amplifier in the silicon substrate and measuring ion current while the noise is removed.

| Explanation of Reference Numerals | |
|---|---|
| 100: | Plasma treatment device |
| 110: | Plasma |
| 130: | Silicon substrate |
| 132: | Resist |
| 200: | On-wafer monitoring system |
| 210: | Data I/O unit |
| 212, 214: | Photo diode |
| 216: | Operation amplifier |
| 218: | Selective circuit |
| 250: | Power source unit |
| 252, 253, 254, 255, 256, 257: | Transistor |
| 262, 263, 264: | Resistor |
| 271, 272, 274: | Electrode |
| 280: | PLZT device |
| 282, 284: | Electrode |
| 400: | Ion energy analyzer |
| 411: | Silicon substrate |
| 412: | Oxide film |
| 413: | Collector electrode |
| 421: | SiO$_2$ layer |
| 422: | Sidewall electrode |
| 424: | Electrode for electron retarding voltage application |
| 426: | Electrode for ion energy separation voltage |
| 427: | Insulating layer |
| 428: | Secondary electron removing electrode |
| 452: | Frequency generator |
| 454: | Lock-in amplifier |
| 500: | Photon detector |
| 513: | Collector electrode |
| 514: | SiO$_2$ film |
| 550: | Photo diode |
| 561: | Silicon substrate |
| 563: | Mirror |

| -continued | |
|---|---|
| Explanation of Reference Numerals | |
| 600: | Radical ion species emission spectrophotometer |
| 610: | Micro electron gun |
| 614: | Power source |
| 615: | Ion collector electrode |
| 616: | Cover |
| 622: | Voltage for electron deceleration electrons |
| 624: | Voltage for ion deceleration |
| 630: | Silicon substrate |
| 631: | Oxide film |
| 632: | Aluminum electrode |
| 633: | Silicon layer |
| 634: | SiO$_2$ layer |
| 635, 636: | Platinum electrode |
| 637: | Cover for avoiding deposition |
| 644: | Pattern |
| 645: | Optical waveguide |
| 650: | Micro spectroscope |
| 651: | Silicon substrate |
| 652: | Oxide film |
| 663: | Aluminum electrode |
| 654: | Silicon layer |
| 655: | Silicon oxide film |
| 656: | Platinum electrode |
| 657: | Electrode |
| 674: | Photo-detecting device |
| 690: | Blazed grating |
| 712: | Electrode for electron emission |
| 714: | Mesh electrode |
| 810: | Electron gun |
| 842, 843: | Photo diode |
| 844: | Narrow-band transmission optical filter |
| 637, 616: | Cover |

What is claimed is:

1. An on-wafer monitoring system capable of measuring an operation of a plasma treatment apparatus on a wafer, said system comprising:

one or a plurality of sensor sections, a power source unit, and an I/O unit that inputs/outputs signals from/to outside, which are provided on a silicon substrate, wherein each of said sensor sections has a pattern portion which comprises an Si02 layer, and which is a plasma treatment target, and under said pattern portion, a plurality of electrodes are disposed for separating ions and electrons of plasma by energy, and an uppermost electrode of said electrodes has the same potential as that of said silicon substrate, and a plurality of pores of predetermined size formed through both said pattern potion and said plurality of electrodes, and a sensor formed at the bottom of each sensor section, wherein said power source unit takes out power from plasma potential or takes out power from photoelectromotive force of a PLZT device.

2. The on-wafer monitoring system according to claim 1, wherein a plurality of electrodes of said sensor sections are Al electrodes, and space between each of the Al electrodes is insulated by γ-Al$_2$O$_3$.

3. The on-wafer monitoring system accordingly to claim 2, wherein the side surface of said Al electrodes is covered with a thin oxide film.

4. The on-wafer monitoring system according to claim 3, wherein said I/O unit inputs/outputs signals from/to outside by light.

5. The on-wafer monitoring system according to claim 1, wherein said system includes an ion energy analyzer, which has a collector electrode at a sensor section bottom and measures ion current in the collector electrode to obtain ion energy distribution, as said sensor.

6. The on-wafer monitoring system according to claim 1, wherein said system includes a photon detector, which detects light made incident into a pattern by photoinduced current generated in an insulating film, as said sensor.

7. The on-wafer monitoring system according to claim 1, wherein said photon detector forms a metal thin film on said insulating film, and detects light having energy equivalent to or more than an energy difference between the work function of the metal and the conduction band bottom of said insulating film out of light transmitted from the metal thin film.

8. The on-wafer monitoring system according to claim 1, wherein said system includes a photon detector that detects light by a photo diode, as said sensor.

9. The on-wafer monitoring system according to claim 1, wherein said system includes an ion radical analyzer, which identifies radicals and ions by detecting light emission by the collision between electrons from an electron gun and radicals or ions, as said sensor.

10. The on-wafer monitoring system according to claim 9, wherein said ion radical analyzer has a spectroscope for detecting light emission.

11. The on-wafer monitoring system according to claim 1, wherein said system includes a probe, which detects at least one of electron current, electron energy distribution, ion current, electron temperature, electron density, and charge storage amount, as said sensor.

* * * * *